(12) United States Patent
Xu et al.

(10) Patent No.: US 9,034,236 B2
(45) Date of Patent: May 19, 2015

(54) SUBSTRATE-BASED ADDITIVE FABRICATION PROCESS

(75) Inventors: Jigeng Xu, South Elgin, IL (US); Ken Dake, South Elgin, IL (US)

(73) Assignee: DSM IP ASSETS B.V., Heerlen (NL)

( * ) Notice: Subject to any disclaimer, the term of this patent is extended or adjusted under 35 U.S.C. 154(b) by 451 days.

(21) Appl. No.: 13/515,641

(22) PCT Filed: Dec. 16, 2010

(86) PCT No.: PCT/US2010/060722
§ 371 (c)(1),
(2), (4) Date: Jun. 13, 2012

(87) PCT Pub. No.: WO2011/084578
PCT Pub. Date: Jul. 14, 2011

(65) Prior Publication Data
US 2012/0251829 A1   Oct. 4, 2012

Related U.S. Application Data

(60) Provisional application No. 61/287,620, filed on Dec. 17, 2009.

(51) Int. Cl.
| | | |
|---|---|---|
| *B29C 35/08* | (2006.01) | |
| *B29C 41/02* | (2006.01) | |
| *B29C 67/00* | (2006.01) | |
| *G03F 7/00* | (2006.01) | |
| *G03F 7/004* | (2006.01) | |
| *G03F 7/027* | (2006.01) | |
| *G03F 7/038* | (2006.01) | |
| *G03F 7/029* | (2006.01) | |
| *B29C 33/00* | (2006.01) | |

(52) U.S. Cl.
CPC ..... *B29C 67/0066* (2013.01); *B29C 2033/0005* (2013.01); *B29C 2035/0827* (2013.01); *G03F 7/0037* (2013.01); *G03F 7/0045* (2013.01); *G03F 7/027* (2013.01); *G03F 7/038* (2013.01); *G03F 7/029* (2013.01)

(58) Field of Classification Search
CPC ............ B29C 2033/0005; B29C 33/44; B29C 67/0055; B29C 67/0062; B29C 67/0066; B29C 67/007
USPC .................................................. 264/334, 401
See application file for complete search history.

(56) References Cited

U.S. PATENT DOCUMENTS

| | | | |
|---|---|---|---|
| 2006/0172230 | A1 | 8/2006 | Lawton et al. |
| 2006/0231982 | A1* | 10/2006 | You ............................... 264/496 |
| 2007/0043205 | A1* | 2/2007 | Dias et al. ..................... 528/373 |
| 2007/0205528 | A1 | 9/2007 | Patel et al. |
| 2007/0259066 | A1 | 11/2007 | Sperry et al. |
| 2008/0169586 | A1 | 7/2008 | Hull et al. |
| 2008/0174050 | A1* | 7/2008 | Kikuchi ........................ 264/401 |
| 2009/0004579 | A1* | 1/2009 | Sarmah et al. .................. 430/18 |
| 2009/0110763 | A1 | 4/2009 | Sperry et al. |
| 2010/0304088 | A1 | 12/2010 | Steeman et al. |

FOREIGN PATENT DOCUMENTS

| | | |
|---|---|---|
| EP | 1852243 | 11/2007 |
| EP | 1946910 | 7/2008 |
| WO | WO 2005/092598 | 10/2005 |
| WO | WO 2007/124911 | 11/2007 |

OTHER PUBLICATIONS

International Search Report for PCT/US2010/060722 mailed Mar. 16, 2011.
Dake et al: "LED Curing Versus Conventional UV Curing Systems: Property Comparisons of Acrylates and Epoxies", Technical Conference Proceedings—UV & EB Technology Expo & Conference, Charlotte, NC, United States, May 2-5, 2004 (2004), pp. 275-280; (Paper & PowerPoint Presentation attached—total of 28 pages).

* cited by examiner

*Primary Examiner* — Leo B Tentoni
(74) *Attorney, Agent, or Firm* — Daniel S. Bujas

(57) ABSTRACT

The invention relates to a substrate-based method for forming a three-dimensional object by additive fabrication by coating a liquid radiation curable resin comprising from 30 to 80 wt % of cationically curable compounds on a substrate, contacting the liquid radiation curable resin with a previously cured layer, selectively exposing the layer of liquid radiation curable layer to actinic radiation thereby forming a cured layer, separating the cured layer at the substrate, and repeating the steps a sufficient number of time in order to build up a three-dimensional object.

24 Claims, 3 Drawing Sheets

SUBSTRATE-BASED ADDITIVE FABRICATION PROCESS

Figure 1:
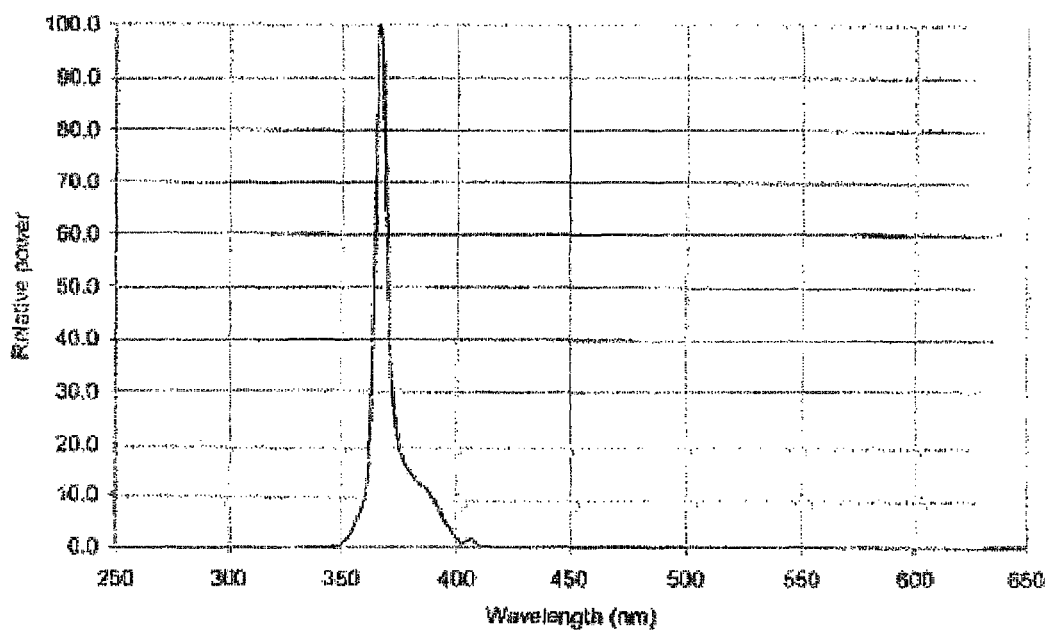

This application is the U.S. national phase of International Application No. PCT/US2010/060722 filed 16 Dec. 2010 which designated the U.S. and claims priority to U.S. Provisional Application No. 61/287,620 filed 17 Dec. 2009, the entire contents of each of which are hereby incorporated by reference.

FIELD OF THE INVENTION

The present invention relates to a substrate based additive fabrication process.

BACKGROUND OF THE INVENTION

Additive fabrication processes for producing three dimensional articles are known in the field. Additive fabrication processes utilize computer-aided design (CAD) data of an object to build three-dimensional parts layer-by-layer. These three-dimensional parts may be formed from liquid resins, powders, or other materials.

A non-limiting example of an additive fabrication process is stereolithography (SL), Stereolithography is a well-known process for rapidly producing models, prototypes, patterns, and production parts in certain applications. SL uses CAD data of an object wherein the data is transformed into thin cross-sections of a three-dimensional object. The data is loaded into a computer which controls a laser beam that traces the pattern of a cross section through a liquid radiation curable resin composition contained in a vat, solidifying a thin layer of the resin corresponding to the cross section. The solidified layer is recoated with resin and the laser beam traces another cross section to harden another layer of resin on top of the previous layer. The process is repeated layer by layer until the three-dimensional object is completed. When initially formed, the three-dimensional object is, in general, not fully cured and therefore may be subjected to post-curing, if required. An example of an SL process is described in U.S. Pat. No. 4,575,330.

The most used method of creating parts from a liquid radiation curable resin is stereolithography. Stereolithography is a vat-based additive fabrication process. Vat-based systems consist of a large reservoir, or vat, of liquid radiation curable resin wherein the imaging occurs. A vertically movable elevator platform is submersed in the vat and is used for supporting the solid three-dimensional object as it is built. Additionally, a recoater is present to assist in forming the next layer of liquid radiation curable resin. The recoater is present at the surface of the liquid radiation curable resin and movable across this surface to assist in forming the next layer of liquid radiation curable resin.

Typically, the building process in vat-based systems is a recurring process consisting of the following repeating steps: 1) the surface of the liquid radiation curable resin is exposed to appropriate imaging radiation by the tracing of a desired cross-section of the three-dimensional object by a laser, thus forming a solid layer; 2) the vertically movable elevator is translated down, further below the surface of the liquid radiation curable resin; 3) the recoater is translated across the surface of the liquid radiation curable resin to assist in forming the next layer of liquid radiation curable resin; and 4) the elevator is translated up such that the distance between the surface of the liquid radiation curable resin and the just formed solid layer of the three-dimensional object is equal to the desired thickness of the layer to be formed. Optionally, there may be a programmed dwell time before the steps are repeated in order to allow the liquid radiation curable resin to equilibrate such that a uniform layer thickness is ensured.

Generally, there are two elements of a stereolithography process that inhibit process speed: 1) the tracing of the laser beam, and 2) the recoating process and optional dwell time. Recently, new additive fabrication systems have been developed with the aim of improving the layer-by-layer process speed.

Firstly, the tracing of the laser beam in a stereolithography process inhibits build speed. The speed of the tracing step is highly dependent on the area and complexity of the cross-section. More tracing must occur for a larger, more complex cross-section than for a smaller, relatively simple one.

Additive fabrication systems have been developed which do not use lasers as the source of imaging radiation in order to make the imaging step less dependent on the complexity of the cross-section. Primarily, the new imaging source is a projection from a DMD (Digital Micromirror Device) or a LCD (Liquid Crystal Display) projector. DMD-based systems utilize a special chip comprising thousands of microscopic mirrors that correspond to pixels of the image. When using such a system in an additive fabrication process, an imaging time that is independent of cross-section complexity can be achieved. Please see U.S. Pat. No. 7,052,263 for an example of a system that utilizes this type of imaging source. In some cases, a second illumination is beneficial to improve image resolution; please see, for example, European Patent EP1744871B1.

Secondly, the recoating process and optional dwell time hinder the speed of a stereolithography process. Because a large amount of liquid radiation curable resin is present in the vat, the recoating process and dwell time cannot be entirely removed with current stereolithography processes and liquid radiation curable resin technology. The speed of the recoating process and dwell time is largely a function of the properties of the liquid radiation curable resin, primarily the viscosity.

Systems have been developed wherein the imaging occurs using a vat-based system that is modified to use a foil or film to aid in forming each layer. Such a technique is disclosed in, for example, U.S. Pat. Nos. 5,171,490, 7,052,263, and 7,438,846.

Further additive fabrication systems have been developed that are known as vat-less systems. Vat-less systems differ from traditional vat-based systems in that the imaging step does not occur within the reservoir of liquid radiation curable resin. Instead, the layer of liquid radiation curable resin is transported to the imaging area one layer at a time. Examples of vat-less systems are disclosed in, for example, European Patent EP1710625 and U.S. Pat. Nos. 6,547,552, 7,614,866, 7,758,799, and 7,731,887. An example of a commercially available vat-less system is the V-FLASH® system available from 3D Systems, Inc.

One common feature of these examples is that they require a step of separating the just cured solid layer from a separating layer or carrier such as a film, foil, glass, or plate. Such separating layers and carriers will be collectively referred to as substrates throughout this application for patent. Moreover, each of these machines employs an upside down build platform wherein the part is translated vertically upwards as it is built rather than vertically downwards as in a traditional stereolithography apparatus.

Although the use of substrates in an additive fabrication process provides several improvements over traditional vat-based systems, the use of substrates also presents several challenges. For instance, the substrate-based process adds the complexity of accurately coating the substrate with liquid radiation curable resin. Furthermore, the increased speed of the process requires that proper green strength is developed in order to facilitate proper peeling from the substrate and bonding to the previously cured layer. Lastly, adhesion of the liquid radiation curable resin to the substrate must be dealt with.

Several patent applications discuss resin formulations useful in a substrate-based additive fabrication process. WO2010/027931 to 3D Systems, Inc discloses a liquid radiation curable resin that comprises only free-radically polymerizable compounds. The compositions of WO2010/027931 include blends of (meth)acrylates and urethane (meth)acrylates. U.S. Pat. No. 7,358,283, assigned to 3D Systems Inc., discloses all acrylate liquid radiation curable resins that are allegedly easily released from substrates. These compositions also require a blend of (meth)acrylates and urethane (meth)acrylates It is well known in the field of liquid radiation curable resins that hybrid liquid radiation curable resins produce cured three-dimensional articles with the most desirable combination of mechanical properties. A hybrid liquid radiation curable resin is a liquid radiation curable resin that comprises both free radical and cationic polymerizable components and photoinitiators. It is also well known that the cationically polymerizable components of a liquid radiation curable resin primarily contribute to the desirable combination of mechanical properties in a cured three-dimensional article, however, the cationically polymerizable components of a liquid radiation curable resin polymerize at a much slower rate than the free-radically polymerizable components. Consequently, the mechanical properties of the cured three-dimensional article develop over time after the initial cure of the hybrid liquid radiation curable resin. The added complexities of known substrate-based additive fabrication processes also contribute to the difficulty of formulating a liquid radiation curable resin for substrate-based additive fabrication processes.

It would thus be desirable to develop hybrid liquid radiation curable resins that are capable of forming cured three-dimensional articles that possess excellent mechanical properties when cured in a substrate-based additive fabrication process.

SUMMARY OF THE INVENTION

The first aspect of the instant claimed invention is a method for forming a three-dimensional object comprising:
1) coating a layer of liquid radiation curable resin comprising from 30 to 80 wt %, more preferably from 35 to 80 wt %, more preferably from 35 to 75 wt %, more preferably from 35 to 70 wt % of at least one cationically curable compound on a substrate;
2) contacting the layer of liquid radiation curable resin with a previously cured layer;
3) selectively exposing the layer of liquid radiation curable resin to actinic radiation, provided by a source of actinic radiation, thereby forming a cured layer which adheres to the previously cured layer;
4) allowing a separation delay time to occur and after the conclusion of the separation delay time separating the cured layer and the substrate; and
5) repeating steps 1-4 a sufficient number of times in order to build up a three-dimensional object;
wherein the separation delay time is the time from first exposure of the layer of liquid radiation curable resin to actinic radiation to the time that the storage shear modulus (G') of the liquid radiation curable resin is measured to have achieved a (G') value of greater than about $9.0 \times 10^5$ Pa, preferably greater than $1.0 \times 10^6$ Pa, more preferably greater than $2.0 \times 10^6$ Pa, as measured from the beginning of light exposure, when the storage shear modulus (G') of the liquid radiation curable resin is measured on a Real Time Dynamic Mechanical Analyzer as the liquid radiation curable resin is cured with a light intensity of 50 mW/cm² for 1.0 second light exposure time.

The second aspect of the instant claimed invention is a three-dimensional object made from the method of the first aspect of the instant claimed invention.

The third aspect of the instant claimed invention is a method for forming a three-dimensional object comprising:
1) coating a layer of liquid radiation curable resin comprising from 30 to 80 wt %, more preferably from 35 to 80 wt %, more preferably from 35 to 75 wt %, more preferably from 35 to 70 wt % of at least one cationically curable compound on a substrate;
2) contacting the layer of liquid radiation curable resin with a previously cured layer;
3) selectively exposing the layer of liquid radiation curable resin to actinic radiation, provided by a source of actinic radiation, thereby forming a cured layer which adheres to the previously cured layer;
4) separating the cured layer and the substrate; and
5) repeating steps 1-4 a sufficient number of times in order to build up a three-dimensional object;
wherein the storage shear modulus (G') of the liquid radiation curable resin is measured to have achieved a (G') value of greater than about $7.5 \times 10^5$ Pa, preferably greater than $8.5 \times 10^5$ Pa, more preferably greater than $9.5 \times 10^5$ Pa at 2.0 seconds from the beginning of light exposure when the storage shear modulus (G') of the liquid radiation curable resin is measured on a Real Time Dynamic Mechanical Analyzer as the liquid radiation curable resin is cured with a light intensity of 50 mW/cm² for 1.0 second light exposure time.

The fourth aspect of the instant claimed invention is a three-dimensional object made from the method of the third aspect of the instant claimed invention.

DETAILED DESCRIPTION OF THE INVENTION

U.S. Provisional application 61/287,620 is hereby incorporated by reference in its entirety.

The first aspect of the instant claimed invention is a method for forming a three-dimensional object comprising:
1) coating a layer of liquid radiation curable resin comprising from 30 to 80 wt %, more preferably from 35 to 80 wt %, more preferably from 35 to 75 wt %, more preferably from 35 to 70 wt % of at least one cationically curable compound on a substrate;
2) contacting the layer of liquid radiation curable resin with a previously cured layer;
3) selectively exposing the layer of liquid radiation curable resin to actinic radiation, provided by a source of actinic radiation, thereby forming a cured layer which adheres to the previously cured layer;
4) allowing a separation delay time to occur and after the conclusion of the separation delay time separating the cured layer and the substrate; and
5) repeating steps 1-4 a sufficient number of times in order to build up a three-dimensional object;
wherein the separation delay time is the time from first exposure of the layer of liquid radiation curable resin to actinic radiation to the time that the storage shear modulus (G') of the liquid radiation curable resin is measured to have achieved a (G') value of greater than about $9.0 \times 10^5$ Pa, preferably greater than $1.0 \times 10^6$ Pa, more preferably greater than $2.0 \times 10^6$ Pa, as measured from the beginning of light exposure, when the storage shear modulus (G') of the liquid radiation curable resin is measured on a Real Time Dynamic Mechanical Analyzer as the liquid radiation curable resin is cured with a light intensity of 50 mW/cm$^2$ for 1.0 second light exposure time.

A substrate is any material that provides a surface on which the liquid radiation curable resin can be irradiated and then separated from. Non-limiting examples of substrates are plates, plastics, or flexible foils. The flexible foil substrates may be elastic, such as silicone film preferred in U.S. Pat. No. 7,438,846 to Envisiontec, or substantially inelastic such as a thin Mylar, or TPX film. Preferably the film is inelastic to reduce any effects caused by movement during cure.

Preferably, the substrate thickness is from about 75 to 200 microns, preferably from about 90 micron to about 160 microns. In an embodiment, the substrate is coated with a material to aid in release of the freshly cured layer from the substrate. In a further embodiment, the substrate is formed from layers of different materials. In an embodiment, the substrate is at least two layers, preferably two or three layers. A multi-layer foil allows for at least a resin contacting barrier layer and a bottom, or middle, non-resin contacting layer. The resin contacting barrier layer provides good chemical resistance and releasing properties, while the under or middle non-resin contacting layer provides thermal and mechanical properties, toughness, bending resistance, and/or fatigue resistance. In a three layer embodiment, the bottom layer is the same as the resin contacting layer. In another embodiment, the bottom layer is different than the resin contacting barrier layer. The resin contacting barrier layer may be a layer of coating.

The choice of substrate is important for the integrity of the additive fabrication process. The substrate is preferably substantially radiation transparent, but the substrate may still be harmed by the repeated exposure of radiation, for instance UV light. A substrate that quickly breaks down in the presence of certain wavelengths of radiation, for instance UV light, must be refreshed. In some cases, a fresh substrate must be provided after each layer is cured.

The first step of the first aspect of the instant claimed invention is to coat a layer of the liquid radiation curable resin on the substrate. Coating can be accomplished by employing, for example, a gravure roller (meyer bar), an applicator, or spray-coating the substrate. A thin layer of liquid radiation curable resin is desired. In an embodiment, the layer of liquid radiation curable resin is from 1 to 1000 microns thick. Preferably, the layer of the liquid radiation curable resin is from about 25 micron to about 250 micron thick, more preferably from 25 micron to 125 micron, more preferably from 25 micron to 75 micron, and of substantially uniform thickness.

The second step of the first aspect of the instant claimed invention is to contact the liquid radiation curable resin on the substrate with a previously cured layer. This may be performed by, for example, moving the substrate, thus bringing into contact the liquid radiation curable resin and the previously cured layer, or by moving the previously cured layer into contact with the liquid radiation curable resin on the substrate. For the first layer of a three-dimensional object, the liquid radiation curable resin may be contacted with a solid build platform such as a build pad or solid plate. It may be desirable to use a slow build speed with higher radiation dose in order to ensure good adherence to the build platform for the initial layer since cohesive strength of the part is not an issue.

The third step of the first aspect of the instant claimed invention is to selectively expose the liquid radiation curable resin to actinic radiation, thereby forming a cured layer which adheres to a previously cured layer. The actinic radiation may come from any suitable source, for instance a laser, lamp, LED, or laser diode. Any appropriate emitting wavelength of light that sufficiently overlaps with the absorbance spectrum of the photoinitiators in the liquid radiation curable resin is suitable. Preferably the wavelength of light is from 300-475 nm, preferably 340-400 nm, more preferably 350-375 nm, more preferably about 365 nm. Preferably, the light source is an LED or array of LEDs.

Selective exposure may occur by, for example, moving a source of actinic radiation across the liquid radiation curable resin and/or by switching the source of actinic radiation on and off in accordance with the desired exposure profile. In another embodiment, the actinic radiation is selectively applied by mask exposure. In a further embodiment, the actinic radiation is applied by using a projection from a DMD. In an embodiment, the actinic radiation must first pass through the substrate to reach the liquid radiation curable resin. In an embodiment, the exposure of the entire layer can occur in one step, for instance by using one projection, or multiple projections which occur simultaneously. In another embodiment, the exposure can occur gradually. For instance, the exposure pattern may be moved across the surface of the liquid radiation curable resin. In this method, certain regions of the same layer of liquid radiation curable resin may be exposed to actinic radiation at times that are significantly different, for instance greater than 15 or even greater than 30 seconds apart, depending on the size of the layer of liquid radiation curable resin being selectively exposed. In another embodiment, the exposure occurs in multiple steps. For instance, the liquid radiation curable resin is exposed to a first exposure and then a second exposure a short time later.

The fourth step of the first aspect of the instant claimed invention is to remove the liquid radiation curable resin from the substrate at a time that exceeds the separation delay time as measured from the time of selective exposure. This step can be performed by moving the cured layer, by moving the substrate, or both. Preferably, the substrate is flexible. A flexible substrate allows for a "first in first out" peeling, wherein the regions of the liquid radiation curable resin that are first irradiated are generally the first to be peeled from the substrate. Please see WO 2010/74566 to TNO, hereby incorporated by reference in its entirety, for a description of an apparatus capable of a "first in first out" peeling.

Although a separation delay time is fixed, as detailed by the storage shear modulus analysis disclosed herein, the time that various regions of the layer are exposed or separated from the substrate is variable. The separation time is the time from selective exposure of the liquid radiation curable resin to actinic radiation to the time that the cured layer and the substrate are separated. The separation time is specific to each region being cured. In a "first in first out" peeling process, or a similar process wherein the selective exposure of the layer of liquid radiation curable resin occurs gradually, the separation time of various regions of the cured layer may not be identical. For instance, certain regions of the same layer of liquid radiation curable resin may be coated, exposed, or peeled at different times when forming a layer. In some embodiments, certain regions of a cured layer may have been separated before other regions of liquid radiation curable resin have even been coated on the substrate. By "separating the cured layer" it is meant that all regions of the cured layer are separated after exposure to actinic radiation at a time greater than the separation delay time, though different regions may be separated at different times. Since the separation time is specific to each region being cured, whether or not the separation delay time has occurred must be determined for each region of the liquid radiation curable resin being cured.

Different regions of a cured layer may have different intervals of time between exposure and separation than other layers. For example, a first region, Region A, has an exposure time of Time J and a separation. Time of K, and a second region, Region B, has an exposure time of Time L and a separation Time of M. (Time K minus Time J) may be the same, equal, or less than (Time M minus Time L). Now, if the Separation Delay Time of the process is determined to be Separation Delay Time X, as determined by the storage shear modulus analysis method disclosed in this application, then both (Time K minus Time J), and (Time M minus Time L) must exceed the Separation Delay Time X. In other embodiments, Region A and Region B may have the same exposure time, but different separation times.

By a region it is meant a section of liquid radiation curable resin that has been exposed to radiation in a sufficient amount to cause substantial curing of the liquid radiation curable resin. Stray radiation or radiation insufficient to cause substantial curing of the liquid radiation curable resin does not define a region. For instance, if a first area of a layer of liquid radiation curable resin is first illuminated by a light source of sufficient intensity to cause substantial curing and a second area of liquid radiation curable resin of the same layer is illuminated by the same or a different light source of sufficient intensity to cause substantial curing at a later time, two regions have been created. Regions may overlap.

The next component of the method of the first aspect of the instant claimed invention is the liquid radiation curable resin. In substrate-based additive fabrication processes, a freshly cured layer of liquid radiation curable resin develops both cohesive strength to the previously cured layer and adhesive strength to the substrate as the layer solidifies. When formulating liquid radiation curable resins for use in substrate-based additive fabrication processes, it is critical that the freshly cured layer of liquid radiation curable resins fully peels off of the substrate. The peeling off of a freshly cured layer of liquid radiation curable resin from the substrate is known as adhesive failure.

Quickly developing good cohesive strength to the previously cured layer is critical for all additive fabrication applications. Cohesive strength is even more important in substrate-based additive fabrication processes because of the added forces caused by the peeling of the substrate from the freshly cured layer of liquid radiation curable resin (adhesive force). Strong adhesion of a freshly cured layer of liquid radiation curable resin to the substrate may cause cohesive failure. Cohesive failure occurs when the freshly cured layer of liquid radiation curable resin adheres more to the substrate than to the previously cured layer and either does not fully separate from the substrate or causes some separation among the previously cured layers. Such cohesive failure is catastrophic for the building of parts in a layer-wise manner. In summary, the build will fail unless the cure of the liquid radiation curable resin can be controlled such that adhesive failure occurs before cohesive failure for each and every layer of the build.

Further complicating matters is that the cured layer must develop sufficient strength on its own so that it can be fully separated from the substrate without fracturing or otherwise falling apart. Generally, this property can be measured as the storage shear modulus (G') of the liquid radiation curable resin using Real-Time Dynamic Mechanical Analysis (RT-DMA). However, even if the cured layer develops sufficient storage shear modulus, it still may have developed too much adhesive strength to the substrate such that cohesive failure or incomplete peeling occurs. Generally, it is desired that a liquid radiation curable resin is able to develop storage shear modulus quickly and have low adhesive strength to the substrate before peeling, Once peeling occurs, it is desirable to quickly build up cohesive strength in the part such that cohesive failure will not occur when building subsequent layers.

Hybrid liquid radiation curable resin formulations have been preferred in additive fabrication applications that do not use a substrate, for example stereolithograplay applications. Generally, the rate of cationic polymerization in a liquid radiation curable resin is considered too slow for rapid prototyping applications unless a sufficient amount of free-radically polymerizable components are incorporated into the liquid radiation curable resin. The rate of photoinitiated free-radical polymerization is very fast, much faster than the rate of photoinitiated cationic polymerization. This fast polymerization is critical for the green strength and cohesive strength buildup necessary for rapid prototyping applications. However, free-radically polymerizable components suffer from high polymerization shrinkage, oxygen inhibition, and rather poor mechanical properties after cure. Despite these shortcomings of free-radically polymerizable components, a liquid radiation curable resin without free-radically polymerizable components will generally cure too slowly for use in rapid prototyping applications.

Furthermore, free-radically polymerizable components generally develop less adhesive strength to the substrate than cationically curable components. Consequently, previous attempts at formulating liquid radiation curable resins for use in substrate-based additive fabrication processes have resulted in entirely free-radically based compositions. Such compositions generally contain a mixture of various (meth) acrylates and/or urethane (meth)acrylates. See U.S. Pat. No. 7,358,283 and WO2010/027931, both to 3D Systems, Inc. Urethane (meth)acrylates are widely known to be mostly incompatible with cationically cured systems. Please see Vabrik et al., Journal of Applied Polymer Science, Vol. 68, 111-119 (1998); (2) U.S. Pat. No. 4,920,156 ("It is, of course, understood by those skilled in the art that when such nitrogen containing compounds are used with photoinitiators, only minor amounts of basic organic nitrogen containing compounds may be used so as not to interfere with the polymerization reaction.")

Because of the slower curing of hybrid liquid radiation curable resins, it is much more difficult to develop a sufficiently high storage shear modulus as the amount of cationically curable components increases. Moreover, hybrid cure resin systems have an increased adhesive strength to the substrate than do liquid radiation curable resins composed of entirely free-radically curable components. Therefore, the ideal scenario in curing a hybrid liquid radiation curable resin in a substrate-based additive fabrication process is to quickly develop green, cohesive or bulk strength while having an initially slow rate of cure in the cationically curable components in order to not develop too much adhesive strength. After peeling occurs, the cationically curable components must cure quickly in order for the three-dimensional object to develop enough green strength so that cohesive failure does not occur in subsequent layers. The time period after peeling is thus critical to the success of the additive fabrication process and must be matched to the curing and adhesion properties of the liquid radiation curable resin.

Various substrate based additive fabrication methods are known. Each of these methods is of varying complexity and presents different challenges to the formulator of a liquid radiation curable resin.

U.S. Pat. No. 7,438,846 to Envisiontec teaches the benefit of a high elasticity substrate, such as a substrate made from silicone or latex, in order to facilitate the separation of cured resin and substrate by facilitating a combination of shearing and peeling effects (col 3, ll.16-22). In this mechanism, the substrate is separated from the cured resin layer by movement in the vertical direction of the elevator holding the part. This patent also discusses the importance of a horizontal component of the force, with the angle changing during the separation process (col. 3, ll. 42-54 and FIGS. 3B and 3C).

U.S. Pat. No. 7,731,887 to 3D Systems, discloses a mechanism that separates the cured layer from the substrate by a shearing process (col. 14, l. 65 to col. 15, l. 5). The mechanism disclosed in this patent uses primarily inelastic substrates, for example PTFE (col. 12 ll. 33-48). U.S. Pat. No. 7,614,866 to 3D Systems discloses a similar method of substrate-based additive fabrication. The separation of the cured resin is separated from the substrate primarily by a shearing action, but the elevator platform can be titled to facilitate removal (col. 25 l. 31 to col. 26 l. 21 and FIGS. 62 and 63). Additionally, it is stated that the elevator or substrate may be twisted to facilitate removal of the substrate.

WO 2010/74566 to TNO teaches an additive fabrication process where the imaging and peeling occur simultaneously. In other words, the imaging of one location of the layer of liquid radiation curable resin occurs while a different location of the same layer, now freshly cured, is separated from the substrate. The peeling angle is constant throughout the build process.

In accordance with the first aspect of the instant claimed invention, the liquid radiation curable resin is able to attain a (G') value of greater than about $9.0 \times 10^5$ Pa, preferably greater than $1.0 \times 10^6$ Pa, more preferably greater than $2.0 \times 10^6$ Pa, when the storage shear modulus (G') of the liquid radiation curable resin is measured on a Real Time-Dynamic Mechanical Analyzer with an 8 mm plate and a sample gap of 0.10 mm, wherein said storage shear modulus (G') is measured as the liquid radiation curable resin is cured with a light intensity of 50 mW/cm$^2$ for 1.0 second exposure time. In an embodiment, the storage shear modulus is measured at an ambient temperature of from 20 to 23° C. and a percent relative humidity of from 25 to 35%. By obtaining the aforementioned storage shear modulus value by the separation delay time, the liquid radiation curable resin is able to develop enough initial strength to be peeled sufficiently from the substrate in one piece. The inventors have discovered that if a liquid radiation curable resin is not able to achieve this value of storage shear modulus by the separation delay time, the substrate-based process will produce three-dimensional articles that are less desirable than the process of the instant claimed invention. Because of the slower curing properties of cationically curable components, it is generally more difficult for a liquid radiation curable resin that comprises a significant amount, for instance greater than 30% by weight, of cationically curable components to attain a sufficiently high storage shear modulus to allow for complete peeling at the separation delay time.

In accordance with the instant claimed method, the freshly cured layer must be separated from the substrate after the separation delay time. The freshly cured layer must not necessarily be peeled exactly at the separation delay time. Instead, the separation delay time must occur at some time before separation occurs. Additionally, the inventors have found that if the cured layer and the substrate are not separated by a certain upper limit time, then the build may fail. Attempting to separate the substrate and the cured layer after the upper limit time will result in cohesive failure among previously cured layers, lack of cohesion of the freshly cured layer to the previously cured layer, and/or only partial separation of the cured layer from the substrate. In an embodiment, this upper limit time is 30.0 seconds, preferably 25.0 seconds, more preferably 20.0 seconds, more preferably 18.0 seconds, more preferably 15.0 seconds, more preferably 10.0 seconds, most preferably 6.0 seconds.

The inventors have surprisingly discovered hybrid liquid radiation curable resins that comprise a sufficient amount of cationically curable components to allow for the formation of three-dimensional objects with excellent mechanical properties and are able to successfully build three-dimensional objects in a substrate-based additive fabrication process in accordance with the first aspect of the instant claimed invention. In embodiments, the liquid radiation curable resins comprise a cationic polymerizable component, a cationic photoinitiator, a free-radical polymerizable component, and a free-radical photoinitiator. Persons of ordinary skill in the art realize that this application for patent discloses the various content ranges of these four components in combination with one another, and that the combination of any of these ranges recited separately does not result in a new invention not disclosed herein when the components are combined in the recited ranges.

The liquid radiation curable resins used in the process of the invention comprise at least 30 wt %, preferably from 30 to 80 wt %, more preferably at least 35 wt %, more preferably from 35 to 80 wt %, more preferably from 35 to 75 wt %, more preferably from 35 to 70 wt % of at least one cationically curable compound. In another embodiment, the liquid radiation curable resin comprises at least 40 wt %, more preferably from 40 to 80 wt %, more preferably from 40 to 75 wt %, more preferably from 40-70 wt % of at least one cationically polymerizable compound.

In accordance with an embodiment, the liquid radiation curable resins of the invention comprise at least one cationically polymerizable component, that is, a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Examples of cationically polymerizable components include cyclic ether compounds such as epoxy compounds and oxetanes, cyclic lactone compounds, cyclic acetal compounds, cyclic thioether compounds, spiro orthoester compounds, and vinylether compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4- epoxycyclohexylmethyl-3',4'-epoxycyclohexane carboxylases, trimethylcaprolactone-modified 3,4-epoxycyclohexylmethyl-3',4'-epoxycyclohexane carboxylates, β-methyl-δ-valerolactone-modified 3,4-epoxycyclohexylmethyl-3',4'-epoxycyclohexane carboxylates, methylenebis(3, 4-epoxycyclohexane), bicyclohexyl-3,3'-epoxide, bis(3,4-epoxycyclohexyl) with a linkage of —S—, —SO—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)—, dicyclopentadiene diepoxide, di(3,4-epoxycyclohexylmethyl)ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, tfimethylolpropane triglycidyl ether, polyethylene glycol diglycidyl ether, polypropylene glycol diglycidyl ether, polyglycidyl ethers of polyether polyol obtained by the addition of one or more alkylene oxides to aliphatic polyhydric alcohols such as ethylene glycol, propylene glycol, and glycerol, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl)ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuyl (3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, and any combination thereof. Examples of polyfunctional materials that are canonically polymerizable include dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In embodiments of the invention, the cationic polymerizable component is at least one selected from the group consisting of a cycloaliphatic epoxy and an oxetane. In a specific embodiment, the cationic polymerizable component is an oxetane, for example, an oxetane containing 2 or more than 2 oxetane groups. In another specific embodiment, the cationic polymerizable component is a cycloaliphatic epoxy, for example, a cycloaliphatic epoxy with 2 or more than 2 epoxy groups.

In an embodiment, the epoxide is 3,4-epoxycyclohexylmethyl-3',4'-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPONEXT™ 1510 from Hexion), 1,4-cyclohexanedimethanol diglycidyl ether (available as HELOXY™ 107 from Hexion), a mixture of dicyclohexyl diepoxide and nanosilica (available as NANOPOX™), and any combination thereof.

The inventors have surprisingly discovered that adding epoxidized polybutadiene to a hybrid liquid radiation curable resin may significantly improve the peeling off properties of a freshly cured resin from a supporting substrate. Depending on the type and grade of epoxidized polybutadiene materials and the concentration of any acrylate in the composition, the addition of from about 5 to about 20 wt %, preferably from about 5 to about 10 wt %, of epoxidized polybutadiene leads to a composition with good film formation and fast green strength buildup. Such compositions have improved peeling off properties from various types of supporting substrates such as, for example, Mylar (i.e. polyester), TPX (i.e. PMP), glass slides, or glass plates. Suitable examples of epoxidized polybutadiene for use in the instant claimed invention are Epolead® PB3600, available from Daicel Chemical, and Poly bd® 600E, available from Sartomer.

The above-mentioned canonically polymerizable compounds can be used singly or in combination of two or more thereof.

In accordance with an embodiment, the polymerizable component of the liquid radiation curable resin is polymerizable by both free-radical polymerization and cationic polymerization. An example of such a polymerizable component is a vinyloxy compound, for example, one selected from the group consisting of bis(4-vinyloxybutyl)isophthalate, tris(4-vinyloxybutyl)trimellitate, and combinations thereof. Other examples of such a polymerizable component include those contain an acrylate and an epoxy group, or an acrylate and an oxetane group, on a same molecule.

In embodiments of the invention, the liquid radiation curable resin used in the process of the invention also includes a cationic photoinitiator. In accordance with an embodiment, the liquid radiation curable resin includes a cationic photoinitiator. The cationic photoinitiator generates photoacids upon irradiation of light. They generate Brönsted or Lewis acids upon irradiation. Any suitable cationic photoinitiator can be used, for example, those selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, sulfonium antimonate salts, ferrocenes, di(cyclopentadienyliron)arene salt compounds, and pyridinium salts, and any combination thereof. Onium salts, e.g., iodonium salts, sulfonium salts and ferrocenes, have the advantage that they are thermally stable. Thus, any residual photoinitiator does not continue to cure after the removal of the irradiating light. Cationic photoinitiators offer the advantage that they are not sensitive to oxygen present in the atmosphere.

Embodiments of the invention include a liquid radiation curable resin includes at least one cationic photoinitiator, wherein the cationic photoinitiator is selected from the group consisting of aromatic diazonium salts, aromatic sulfonium salts, aromatic iodonium salts, metallocene based compounds, aromatic phosphonium salts and silanol aluminium complexes, and any combination thereof. In an embodiment, the cationic photoinitiator is selected from the group consisting of aromatic sulfonium salts, aromatic iodonium salts, and metallocene based compounds, and any combination thereof.

In another embodiment, the cationic photoinitiator is selected from the group consisting of triarylsulfonium salts, diaryliodonium salts, and metallocene based compounds, and any combination thereof.

In a particular embodiment, the cationic photoinitiator has an anion selected from the group consisting of $BF_4^-$, $AsF_6^-$, $SbF_6^-$, $PF_6^-$, $B(C_6F_5)_4^-$, perfluoroalkylsulfonates, perfluoroalkylphosphates, and carborane anions.

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, perfluoroalkylsulfonates, perfluoroalkylphosphates, and $(CH_6B_{11}Cl_6)^-$.

In a particular embodiment, the cationic photoinitiator is an aromatic sulfonium salt based cationic photoinitiator selected from the group consisting of 4-(4-benzoylphenylthio)phenyldiphenylsulfonium hexafluoroantimonate, 4-(4-benzoylphenylthio)phenylbis(4-hydroxyethyloxyphenyl)sulfonium hexafluoroantimonate, 4-(4-benzoylphenylthio)phenylbis(4-fluorophenyl)sulfonium hexafluoroantimonate, 4-(4-benzoylphenylthio)phenylbis(4-chlorophenyl)sulfonium hexafluoroantimonate, 4-[4-(3-chlorobenzoyl)phenylthio]phenylbis(4-fluorophenyl)sulfonium hexafluoroantimonate, 4-(4-benzoylphenylthio)phenylbis(4-methylphenyl)sulfonium hexafluoroantimonate, 4-(4-benzoylphenylthio)phenylbis(4-hydroxyethylphenyl)sulfonium hexafluoroantimonate, 4-[4-(4-hydroxyethyloxybenzoyl)phenylthio]phenylbis(4-fluoro phenyl)sulfonium hexafluoroantimonate, 4-[4-(4-hydroxyethyloxybenzoyl)phenylthio]phenyldiphenylsulfonium hexafluoroantimonate, 4-[4-(4-hydroxyethyloxybenzoyl)phenylthio]phenylbis(4-hydroxyethyloxyphenyl)sulfonium hexafluoroantimonate, 4-(4-benzoylphenylthio)phenylbis(4-methoxyethoxyphenyl)sulfonium hexafluoroantimonate, 4-[4-(3-methoxybenzoyl)phenylthio]phenyldiphenylsulfonium hexafluoroantimonate, 4-[4-(3-methoxycarbonylbenzoyl)phenylthio]phenyldiphenylsulfonium hexafluoroantimonate, 4-[4-(2-hydroxymethylbenzoyl)phenylthio]phenyldiphenylsulfonium hexafluoroantimonate, 4-[4-(4-methylbenzoyl)phenylthio]phenylbis(4-fluorophenyl)sulfonium hexafluoroantimonate, 4-[4-(4-)phenylthio]phenylbis(4-fluorophenyl)sulfonium hexafluoroantimonate, 4-[4-(4-fluorobenzoyl)phenylthio]phenylbis(4-fluorophenyl)sulfonium hexafluoroantimonate, 4-[4-(2-methoxycarbonylbenzoyl)phenylthio]phenylbis(4-fluoro phenyl)sulfonium hexafluoroantimonate, bis[4-(diphenylsulfonio)phenyl]sulfide bishexafluorophosphate, bis[4-(diphenylsulfonio)phenyl]sulfide bistetrafluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluoroantimonate, triphenylsulfonium hexafluorophosphate, triphenylsulfonium tetrafluoroborate, triphenylsulfonium tetrakis(pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bistetrafluoroborate, and bis[4-(di(4-(2-hydroxyethoxy))phenylsulfonio)phenyl]sulfide tetrakis(pentafluorophenyl)borate, and any combination thereof.

In another embodiment, the cationic photoinitiator is an aromatic iodonium salt based cationic photoinitiator selected from the group consisting of diphenyliodonium hexafluorophosphate, diphenyliodonium hexafluoroantimonate, diphenyliodonium tetrafluoroborate, diphenyliodonium tetrakis(pentafluorophenyl)borate, bis(dodecylphenyl)iodonium hexafluorophosphate, bis(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate, and 4-methylphenyl-4-(1-methylethyl)phenyliodonium tetrakis(pentafluorophenyl)borate, and any combination thereof.

In certain embodiments, the cationic photoinitiator is selected from the group consisting of tetrakis(pentafluorophenyl)borate or hexafluoroantimonate salt of 4-(4-benzoylphenylthio)phenyldiphenylsulfonium, 4-(4-benzoylphenylthio)phenylbis(4-hydroxyethyloxyphenyl)sulfonium, 4-(4-benzoylphenylthio)phenylbis(4-fluorophenyl)sulfonium, 4-(4-benzoylphenylthio)phenylbis(4-chlorophenyl)sulfonium, 4-[4-(3-chlorobenzoyl)phenylthio]phenylbis(4-fluorophenyl)sulfonium, 4-[4-(2-chlorobenzoyl)phenylthio]phenylbis(4-fluorophenyl)sulfonium, (4-thiophenoxyphenyl)diphenylsulfonium, S,S,S',S'-tetraphenylthiobis(4,1-phenylene)disulfonium, triphenylsulfonium, (chlorophenyl)diphenylsulfonium, chloro[S-(phenyl)thianthrenium], S-(phenyl)thianthrenium, diphenyl-4-(4'-thiophenoxy)thiophenoxyphenylsulfonium, phenyldi(4-thiophenoxyphenyl)sulfonium, S-(4-thiophenoxyphenyl)thianthrenium, and (thiodi-4,1-phenylene)bis[bis[4-(2-hydroxyethoxy)phenyl]sulfonium, tris(4-(4-acetylphenyl)thiophenyl)sulfonium, bis(4-dodecylphenyl)iodonium, [4-[(2-hydroxytetradecyl)oxy]phenyl]phenyliodonium, (4-methylphenyl)[4-[[2-[[[[3-(trifluoromethyl)phenyl]amino]carbonyl]oxy]tetradecyl]oxy]phenyl]iodonium, bis(4-dodecylphenyl)iodonium, [4-(1-methylethyl)phenyl](4-methylphenyl)iodonium, and any combination thereof.

In an illustrative embodiment, the liquid radiation curable resin includes a cationic photoinitiator selected from the group consisting of triarylsulfonium $SbF_6^-$, triarylsulfonium borate, tris(4-(4-acetylphenyl)thiophenyl)sulfonium tetrakis(pentafluorophenyl)borate, diaryliodonium borate, iodonium [4-(1-methylethyl)phenyl](4-methylphenyl)-tetrakis(pentafluorophenyl)borate, and any combination thereof. A nonnucleophilic anion serves as the counterion. Examples of such anions include $BF_4^-$, $AsF_6^-$, $SbF_6^-$, $PF_6^-$, $B(C_6F_5)_4^-$, perfluoroalkylsulfonates, perfluoroalkylphosphates, and carborane anions such as $(CH_6B_{11}Cl_6)^-$.

Examples of cationic photoinitiators useful for curing at 300-475 nm, particularly at 365 nm. UV light, without a sensitizer include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl)sulfonium tetrakis(pentafluorophenyl)borate, and tris(4-(4-acetylphenyl)thiophenyl)sulfonium tetrakis(pentafluorophenyl)borate (GSID4480-1 also known as IRGACURE® PAG 290) from Ciba used in some of the example compositions.

In some embodiments it is desirable for the liquid radiation curable resin to include a photosensitizer. The term "photosensitizer" is used to refer to any substance that either increases the rate of photoinitiated polymerization or shifts the wavelength at which polymerization occurs; see textbook by G. Odian, Principles of Polymerization, $3^{rd}$ Ed., 1991, page 222. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl⁻ methanone, isopropyl-9H-thioxanthen-9-one, 1-pyrenemethanol, 9-(hydroxymethyl)anthracene, 9,10-diethoxyanthracene, 9,10-dimethoxyanthracene, 9,10-dipropoxyanthracene, 9,10-dibutyloxyanthracene, 9-anthracenernethanal acetate, 2-ethyl-9,10-dimethoxyanthracene, 2-methyl-9,10-dimethoxyanthracene, 2-t-butyl-9, 10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate, methyl-2-benzoyl benzoate, 4-benzoyl-4'-methyl diphenyl sulphide, 4,4'-bis(diethylamino) benzophenone, and any combination thereof.

Additionally, photosensitizers are useful in combination with photoinitiators in effecting cure with LED light sources emitting in the wavelength range of 300-475 nm. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis (diethylamino)benzophenone (Chivacure EMK from Chitec).

In an embodiment, the photosensitizer is a fluorone, e.g., 5,7-diiodo-3-butoxy-6-fluorone, 5,7-diiodo-3-hydroxy-6-fluorone, 9-cyano-5,7-diiodo-3-hydroxy-6-fluorone, or a photosensitizer is

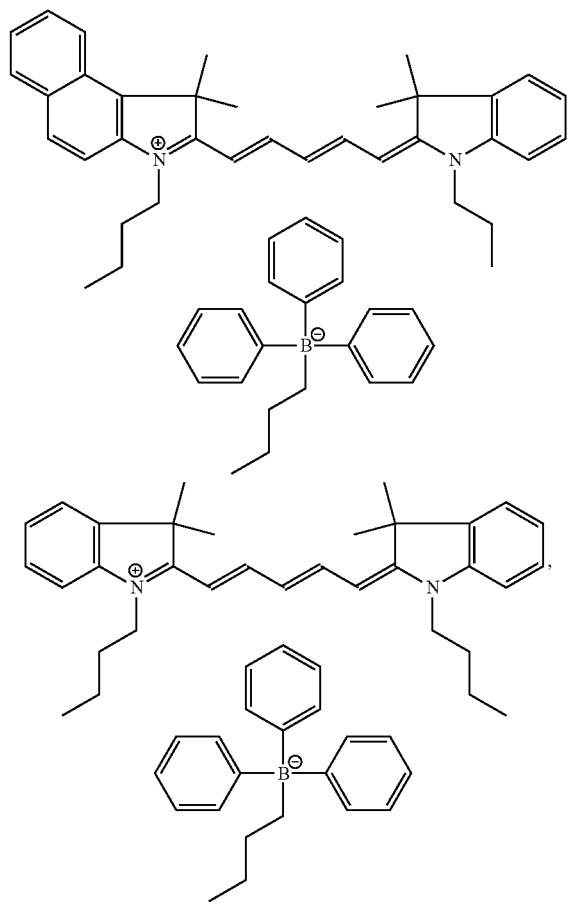

and any combination thereof.

The liquid radiation curable resin can include any suitable amount of the photosensitizer, for example, in certain embodiments, in an amount up to about 10% by weight of the composition, in certain embodiments, up to about 5% by weight of the composition, and in further embodiments from about 0.05% to about 2% by weight of the composition.

When photosensitizers are employed, other photoinitiators absorbing at shorter wavelengths can be used. Examples of such photoinitiators include: benzophenones, such as benzophenone, 4-methyl benzophenone, 2,4,6-trimethyl benzophenone, and dimethoxyberizophenone, and 1-hydroxyphenyl ketones, such as 1-hydroxycyclohexyl phenyl ketone, phenyl(1-hydroxyisopropyl)ketone, 2-hydroxy-1-[4-(2-hydroxyethoxy)phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl]propanone] (Esacure KIP 150 from Lamberti). These photoinitiators when used in combination with a photosensitizer are suitable for use with LED light sources emitting at wavelengths from about 100 nm to about 300 nm.

LED light sources that emit visible light are also known. For LED light sources emitting light at wavelengths greater than about 400 nm, e.g., from about 475 nm to about 900 nm, examples of suitable photoinitiators include: camphorquinone, 4,4'-bis(diethylamino)benzophenone (Chivacure EMK from Chitec), 4,4'-bis(N,N-dimethylamino)benzophenone (Michler's ketone), bis(2,4,6-trimethylbenzoyl)-phenylphosphineoxide (Irgacure 819 or BAPO from Ciba), metallocenes such as bis(eta 5-2-4-cyclopentadien-1-yl)bis [2,6-difluoro-3-(1H-pyrrol-1-yl)phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

A photosensitizer or co-initiator may be used to improve the activity of the cationic photoinitiator. It is for either increasing the rate of photoinitiated polymerization or shifting the wavelength at which polymerization occurs. The sensitizer used in combination with the above-mentioned cationic photoinitiator is not particularly limited. A variety of compounds can be used as photosensitizers, including heterocyclic and fused-ring aromatic hydrocarbons, organic dyes, and aromatic ketones. Examples of sensitizers include compounds disclosed by J. V. Crivello in *Advances in Polymer Science,* 62, 1 (1984), and by J. V. Crivello & K. Dietliker, "Photoinitiators for Cationic Polymerization" in Chemistry & technology of UV & EB formulation for coatings, inks & paints. Volume III, Photoinitiators for free radical and cationic polymerization by K. Dietliker; [Ed. by P. K. T. Oldring], SITA Technology Ltd, London, 1991. Specific examples include polyaromatic hydrocarbons and their derivatives such as anthracene, pyrene, perylene and their derivatives, thioxanthones, α-hydroxyalkylphenones, 4-benzoyl-4'-methyldiphenyl sulfide, acridine orange, and benzoflavin.

There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708, 296 and 5,002,856. All eight of these disclosures are hereby incorporated in their entirety by reference. Other cationic photoinitiators are metallocene salts, such as described, for example, in published European applications EP 94914 and 94915, which are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring).

Suitable ferrocene type cationic photoinitiators include, for example, di(cyclopentadienyliron)arene salt compounds of formula (I) as disclosed in Chinese Patent No. CN 101190931:

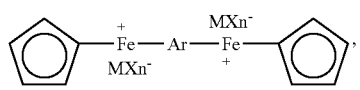

I wherein anion MXn is selected from BF4, PF6, SbF6, AsF6, (C6F5)4B, ClO4, CF3SO3, FSO3, CH3SO3, C4F9SO3, and Ar is a fused ring or polycyclic arene.

Other illustrative ferrocene type cationic photoinitiators include, for example, (η6-Carbazole)(η5-cyclopenta-dienyl) iron hexafluorophosphate salts, specifically [cyclopentadiene-Fe—N-butylcarbazole]hexafluoro-phosphate (C4-CFS PF6) and [cyclopentadiene-Fe—N-octyl-carbazole] hexafluorophosphate (C8-CFS PF6), bearing C4 and C8 alkyl chains, respectively, on the nitrogen atom (see Polymer Eng. & Science (2009), 49(3), 613-618); ferrocenium dication salts, e.g., biphenyl bis[(π-cyclopentadienyl)iron] hexafluorophosphate ([bis(Cp-Fe)-biphenyl](PF6)2) and straight cyclopentadien-iron-biphenyl hexafluorophosphate ([Cp-Fe-biphenyl]+PF6−) as disclosed in Chinese J. Chem. Engnrng (2008), 16(5), 819-822 and Polymer Bulltn (2005), 53(5-6), 323-331; cyclopentadienyl-Fe-carbazole hexafluorophosphate ([Cp-Fe-carbazole]+PF6−), cyclopentadienyl-Fe—N-ethylcarbazole hexafluorophosphate ([Cp-Fe-n-ethylcarbazole]+PF6−) and cyclopentadienyl-Fe-aminonaphthalene hexafluorophosphate ([Cp-Fe-aminonaphthalene]+PF6−) as disclosed in J Photochem. & Photobiology, A: Chemistry (2007), 187(2-3), 389-394 and Polymer Intnl (2005), 54(9), 1251-1255; alkoxy-substituted ferrocenium salts, for example, [cyclopendadien-Fe-anisole] PF6, [cyclopendadien-Fe-anisole]BF4, [cyclopendadien-Fe-diphenylether]PF6, [cyclo-pendadien-Fe-diphenylether] BF4, and [cyclopendadien-Fe-diethoxy-benzene]PF6, as disclosed in Chinese J. of Chem Engnrng (2006), 14(6), 806-809; cyclopentadiene-iron-arene tetrafluoroborates, for example, cyclopentadiene-iron-naphthalene tetrafluoroborate ([Cp-Fe-Naph]BF4) salt, as disclosed in Imaging Science J (2003), 51(4), 247-253; ferrocenyl tetrafluoroborate ([Cp-Fe—CP]BF4), as disclosed in Ganguang Kexue Yu Guang Huaxue (2003), 21(1), 46-52; [CpFe(η6-tol)]BF4, as disclosed in Ganguang Kexue Yu Guang Huaxue (2002), 20(3), 177-184, Ferrocenium salts (η6-α-naphthoxybenzene) (η5-cyclopentadienyl)iron hexafluorophosphate (NOFC-1) and (η6-β-naphthoxybenzene) (η5-cyclopentadienyl)iron hexafluorophosphate (NOFC-2), as disclosed in Int. J of Photoenergy (2009), Article ID 981065; (η6-Diphenylmethane) (η5-cyclopentadienyl)iron hexafluorophosphate and (η6-benzophenone) (η5-cyclopenta-dienyl)iron hexafluorophosphate, as disclosed in Progress in Organic Coatings (2009), 65(2), 251-256; [CpFe(η6-isopropyl-benzene)]PF6, as disclosed in Chem Comm (1999), (17), 1631-1632; and any combination thereof.

Suitable onium type cationic photoinitiators include, for example, iodonium and sulfonium salts, as disclosed in Japanese Patent JP 2006151852. Other illustrative onium type photoinitiators include, for example, onium salts such as, diaryliodonium salts, triarylsulfonium salts, aryl-diazonium salts, ferrocenium salts, diarylsulfoxonium salts, diaryl-iodoxonium salts, triaryl-sulfoxonium salts, dialkylphenacylsulfonium salts, dialkylhydroxy-phenylsulfonitium salts, phenacyl-triarylphosphonium salts, and phenacyl salts of heterocyclic nitrogen-containing compounds, as disclosed in U.S. Pat. Nos. 5,639,413; 5,705,116; 5,494,618; 6,593,388; and Chemistry of Materials (2002), 14(11), 4858-4866; aromatic sulfonium or iodonium salts as disclosed in U.S. Patent Application No. 2008/0292993; diaryl-, triaryl-, or dialkylphenacylsulfonium salts, as disclosed in US2008260960 and J. Poly Sci, Part A (2005), 43(21), 5217; diphenyl-iodonium hexafluorophosphate (Ph2I+PF6−), as disclosed in Macromolecules (2008), 41(10), 3468-3471; onium salts using onium salts using less toxic anions to replace, e.g., SbF6-. Mentioned are anions: B(C6F5)4-, Ga(C6F5)4- and perfluoroalkyl fluorophosphate, PFnRf(6-n)-, as disclosed in Nettowaku Porima (2007), 28(3), 101-108; Photoactive allyl ammonium salt (BPEA) containing benzophenone moiety in the structure, as disclosed in Eur Polymer J (2002), 38(9), 1845-1850; 1-(4-Hydroxy-3-methylphenyl)tetrahydrothiophenium hexafluoroantimonate, as disclosed in Polymer (1997), 38(7), 1719-1723; and any combination thereof.

Illustrative iodonium type cationic photoinitiators include, for example, diaryliodonium salts having counterions like hexafluoro-phosphate and the like, such as, for example, (4-n-pentadecyloxy-phenyl)phenyliodonium hexa-fluoroantimonate, as disclosed in US2006041032; diphenyliodonium hexafluorophosphate, as disclosed in U.S. Pat. No. 4,394,403 and Macromolecules (2008), 41(2), 295-297; diphenyliodonium ions as disclosed in Polymer (1993), 34(2), 426-8; Diphenyliodonium salt with boron tetrafluoride (Ph2I+ BF4−), as disclosed in Yingyong Huaxue (1990), 7(3), 54-56; SR-1012, a diaryldiodonium salt, as disclosed in Nuclear Inst. & Methods in Physics Res, B (2007), 264(2), 318-322; diaryliodonium salts, e.g., 4,4'-di-tert-butyldiphenyl-iodonium hexafluoroarsenate, as disclosed in J Polymr Sci, Polymr Chem Edition (1978), 16(10), 2441-2451; Diaryliodonium salts containing complex metal halide anions such as diphenyliodonium fluoroborate, as disclosed in 0.1 Sci, Poly Sympos (1976), 56, 383-95; and any combination thereof.

Illustrative sulfonium type cationic photoinitiators include, for example, UVI 6992 (sulfonium salt) as disclosed in Japanese patent JP2007126612; compounds of the formula:

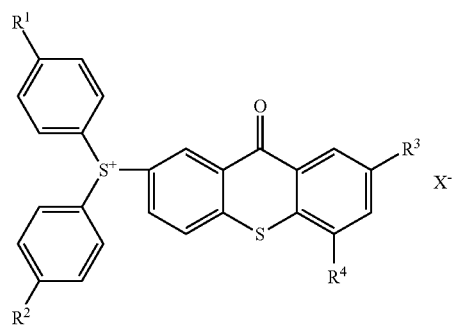

where R1-2=F; R3=isopropyl; R4=H; X=PF6, as disclosed in Japanese patent JP10101718; thioxanthone-based sulfonium salts, e.g., of the formula:

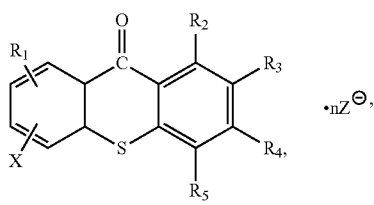

as disclosed in U.S. Pat. No. 6,054,501; (Acyloxyphenyl) sulfonium salts of the type R$_3$-xS+R3x A-, where A- is a non-nucleophilic anion such as AsF$_6$—, and R3 may be the phenyl group shown below:

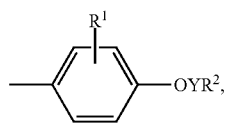

as disclosed in U.S. Pat. Nos. 5,159,088; 9,10-dithiophenoxyanthracene alkyldiarylsulfonium salts, e.g., ethylphenyl (9-thiophenoxy-anthracenyl-10)sulfonium hexafluoroantimonate, and the like, as disclosed in U.S. Pat. No. 4,760,013; etc.; triphenylsulfonium hexafluorophosphate salt, as disclosed in U.S. Pat. No. 4,245,029; S,S-dimethyl-S-(3,5-dimethyl-2-hydroxyphenyl)sulfonium salts, as disclosed in J Poly Sci, Part A (2003), 41(16), 2570-2587; Anthracene-bound sulfonium salts, as disclosed in J Photochem & Photobiology, A: Chemistry (2003), 159(2), 161-171; triarylsulfonium salts, as disclosed in J Photopolymer Science & Tech (2000), 13(1), 117-118 and J Poly Science, Part A (2008), 46(11), 3820-29; S-aryl-S,S-cycloalkylsulfonium salts, as disclosed in J Macromol Sci, Part A (2006), 43(9), 1339-1353; dialkylphenacylsulfonium salts, as disclosed in UV & EB Tech Expo & Conf, May 2-5, 2004, 55-69 and ACS Symp Ser (2003), 847, 219-230; Dialkyl(4-hydroxyphenyl)sulfonium salts, and their isomeric dialkyl(2-hydroxyphenyl)sulfonium salts, as disclosed in ACS 224th Natnl Meeting, Aug. 18-22, 2002, POLY-726; Dodecyl(4-hydroxy-3,5-dimethylphenyl)methylsulfonium hexafluorophosphate and similar alkyl analogs other than dodecyl. Tetrahydro-1-(4-hydroxy-3,5-dimethylphenyl)thiophenium hexafluorophosphate and tetrahydro-1-(2-hydroxy-3,5-dimethylphenypthiophenium hexafluorophosphate, as disclosed in ACS Polymer Preprints (2002), 43(2), 918-919; photoinitiators with the general structure Ar'S+CH3(C12H25)SbF6-, where Ar' is phenacyl (I), 2-indanonyl (II), 4-methoxyphenacyl (III), 2-naphthoylmethyl (IV), 1-anthroylmethyl (V), or 1-pyrenoylmethyl (VI), as disclosed in J Polymr Sci, Part A (2000), 38(9), 1433-1442; Triarylsulfonium salts Ar3S+MXn- with complex metal halide anions such as BF4-, AsF6-, PF6-, and SbF6-, as disclosed in J Polymr Sci, Part A (1996), 34(16), 3231-3253; Dialkylphenacylsulfonium and dialkyl(4-hydroxyphenyl)sulfonium salts, as disclosed in Macromolecules (1981), 14(5), 1141-1147; Triarylsulfonium salts R2R1S+MFn- (R, R1=Ph or substituted phenyl; M=B, As, P; n=4 or 6) and the sulfonium salt of formula (I):

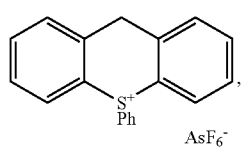

I as disclosed in J. Polymr. Sci, Polymr Chem Edition (1979), 17(4), 977-99; aromatic sulfonium salts with, e.g., PF6- anion, e.g., UVI 6970, as disclosed in JP 2000239648; and any combination thereof.

Suitable pyridinium type cationic photoinitiators include, for example, N-ethoxy 2-methylpyridinium hexafluorophosphate (EMP+ PF6-), as disclosed in Turkish J of Chemistry (1993), 17(1), 44-49; Charge-transfer complexes of pyridinium salts and aromatic electron donors (hexamethyl-benzene and 1,2,4-trimethyoxy-benzene), as disclosed in Polymer (1994), 35(11), 2428-31; N,N'-diethoxy-4,4'-azobis (pyridinium)hexafluorophosphate (DEAP), as disclosed in Macromolecular Rapid Comm (2008), 29(11), 892-896; and any combination thereof.

Other suitable cationic photoinitiators include, for example, Acylgermane based photoinitiator in the presence of onium salts, e.g., benzoyltrimethylgermane (BTG) and onium salts, such as diphenyl-iodonium hexafluorophosphate (Ph2I+PF6-) or N-ethoxy-2-methyl-pyridinium hexafluorophosphate (EMP+PF6-), as disclosed in Macromolecules (2008), 41(18), 6714-6718; Di-Ph diselenide (DPDS), as disclosed in Macromolecular Symposia (2006), 240, 186-193; N-phenacyl-N,N-dimethyl-anilinium hexafluoroantimonate (PDA+SbF6-), as disclosed in Macromol Rapid Comm (2002), 23(9), 567-570; Synergistic blends of: diaryliodonium hexafluoro-antimonate (IA) with tolylcumyl-iodonium tetrakis(pentafluoro-phenyl)borate (IB), and cumenecyclopentadienyliron(II) hexafluorophosphate with IA and IB, as disclosed in Designed Monomers and Polymers (2007), 10(4), 327-345; Diazonium salts, e.g., 4-(hexyloxy)-substituted diazonium salts with complex anions, as disclosed in ACS Symp Series (2003), 847, 202-212; 5-Arylthianthrenium salts, as disclosed in J Poly Sci, Part A (2002), 40(20), 3465-3480; and any combination thereof.

Other suitable cationic photoinitiators include, for example, triarylsulfonium salts such as triarylsulfonium borates modified for absorbing long wavelength UV. Illustrative examples of such modified borates include, for example, SP-300 available from Denka, tris(4-(4-acetylphenyl) thiophenyl)sulfonium tetrakis(pentafluorophenyl)borate (GSID4480-1) available from Ma/BASF, and those photoinitiators disclosed in WO1999028295; WO2004029037; WO2009057600; U.S. Pat. No. 6,368,769 WO2009047105; WO2009047151; WO2009047152; US 20090208872; and U.S. Pat. No. 7,611,817.

Preferred cationic photoinitiators include a mixture of: bis[4-diphenylsulfoniumphenyl]sulfide bishexafluoroantimonate; thiophenoxyphenylsulfonium hexafluoroantimonate (available as Chivacure 1176 from Chitec); tris(4-(4-acetylphenyl)thiophenyl)sulfonium tetrakis(pentafluorophenyl)borate (GSID4480-1 from Ciba/BASF), tris(4-(4-acetylphenyl)thiophenyl)sulfonium hexafluoroantimonate, iodonium, [4-(1-methylethyl)phenyl](4-methylphenyl)-, tetrakis(pentafluorophenyl)borate (available as Rhodorsil 2074 from Rhodia), 4-[4-(2-chlorobenzoyl)phenylthio]phenylbis (4-fluorophenyl)sulfonium hexafluoroantimonate (as SP-172) and SP-300 (both available from Adeka).

The liquid radiation curable resin may include any suitable amount of the cationic photoinitiator, for example, in certain embodiments, in an amount an amount up to about 20% by weight of the composition, in further embodiments from about 0.5% to about 10% by weight of the composition, and in further embodiment from about 1 to about 5 wt % of the composition. In an embodiment, the above ranges are particularly suitable for use with epoxy monomers.

In accordance with an embodiment of the invention, the liquid radiation curable resins of the invention comprises at least one free-radical polymerizable component, that is, a component which undergoes polymerization initiated by free radicals. The free-radical polymerizable components are monomers, oligomers, and/or polymers; they are monofunctional or polyfunctional materials, i.e., have 1, 2, 3, 4, 5, 6, 7, 8, 9, 10, 20, 30, 40, 50, 100, or more functional groups that can polymerize by free radical initiation, may contain aliphatic, aromatic, cycloaliphatic, arylaliphatic, heterocyclic moiety(ies), or any combination thereof. Examples of polyfunctional materials include dendritic polymers such as dendrimers, linear dendritic polymers, dendrigraft polymers, hyperbranched polymers, star branched polymers, and hypergraft polymers; see US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl(meth)acrylate, bornyl(meth)acrylate, tricyclodecanyl(meth)acrylate, dicyclopentanyl(meth)acrylate, dicyclopentenyl(meth)acrylate, cyclohexyl(meth)acrylate, benzyl (meth)acrylate, 4-butylcyclohexyl(meth)acrylate, acryloyl morpholine, (meth)acrylic acid, 2-hydroxyethyl (meth)acrylate, 2-hydroxypropyl(meth)acrylate, 2-hydroxybutyl (meth)acrylate, methyl (meth)acrylate, ethyl (meth)acrylate, propyl(meth) acrylate, isopropyl(meth)acrylate, butyl (meth)acrylate, amyl (meth)acrylate, isobutyl (meth)acrylate, t-butyl (meth)acrylate, pentyl(meth)acrylate, caprolactone acrylate, isoamyl (meth)acrylate, hexyl(meth)acrylate, heptyl(meth)acrylate, octyl(meth)acrylate, isooctyl(meth)acrylate, 2-ethylhexyl (meth)acrylate, nonyl(meth)acrylate, decyl(meth)acrylate, isodecyl(meth)acrylate, tridecyl(meth)acrylate, undecyl (meth)acrylate, lauryl(meth)acrylate, stearyl(meth)acrylate, isostearyl(meth)acrylate, tetrahydrofurfuryl(meth)acrylate, butoxyethyl (meth)acrylate, ethoxydiethylene glycol (meth) acrylate, benzyl (meth)acrylate, phenoxyethyl (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl(meth)acrylamide fluorinated (meth)acrylate, 7-amino-3,7-dimethyloctyl(meth)acrylate.

Examples of polyfunctional free-radical polymerizable components include those with (meth)acryloyl groups such as trimethylolpropane tri(meth)acrylate, pentaerythritol (meth)acrylate, ethylene glycol di(meth)acrylate, bisphenol. A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro [5.5]undecane di(meth)acrylate; dipentaerythritol monohydroxypenta(meth)acrylate, propoxylated trimethylolpropane tri(meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri (meth)acrylate, tris(2-hydroxyethyl)isocyanurate di(meth) acrylate, pentaerythritol tri(meth)acrylate, pentaerythritol tetra(meth)acrylate, dipentaerythritol hexa(meth)crylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol. A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the polyfunctional (meth)acrylates of the polyfunctional component may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate, dipentaerythritol monohydroxypenta(meth)acrylate, dipentaerythritol hexa(meth)crylate, propoxylated trimethylolpropane tri(meth)acrylate, and propoxylated neopentyl glycol di(meth)acrylate, and any combination thereof.

In another embodiment, the free-radical polymerizable component is selected from the group consisting of bisphenol. A diglycidyl ether diacrylate, dicyclopentadiene dimethanol diacrylate, [2-[1,1-dimethyl-2-[(1-oxoallyl)oxy] ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof.

In specific embodiments, the photocurable resin compositions for additive fabrication of the invention include one or more of bisphenol A diglycidyl ether di(meth)acrylate, dicyclopentadiene dimethanol di(meth)acrylate, dipentaerythritol monohydroxypenta(meth)acrylate, propoxylated trimethylolpropane tri(meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol monohydroxypentaacrylate, propoxylated trimethylolpropane triacrylate, and/or propoxylated neopentyl glycol diacrylate.

The liquid radiation curable resin can include any suitable amount of the free-radical polymerizable component, for example, in certain embodiments, in an amount up to about 60% by weight of the composition, in certain embodiments, up to about 50% by weight of the composition. In further embodiments from about 15% to about 50% by weight of the composition, in other embodiments from about 15 to about 40 wt % of the composition.

The liquid radiation curable resin can include a free-radical photo-initiator. Typically, free radical photoinitiators are divided into those that form radicals by cleavage, known as "Norrish Type I" and those that form radicals by hydrogen abstraction, known as "Norrish type II". The Norrish type II photoinitiators require a hydrogen donor, which serves as the free radical source. As the initiation is based on a bimolecular reaction, the Norrish type II photoinitiators are generally slower than Norrish type I photoinitiators which are based on the unimolecular formation of radicals. On the other hand, Norrish type II photoinitiators possess better optical absorption properties in the near-UV spectroscopic region. Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a liquid radiation curable resin composition useful in the claimed process, it is necessary to review the wavelength sensitivity of the photoinitiators) present in the composition to determine if they will be activated by the LED light chosen to provide the curing light.

In accordance with an embodiment, the liquid radiation curable resin includes at least one free radical photoinitiator, e.g., those selected from the group consisting of benzoylphosphine oxides, aryl ketones, benzophenones, hydroxylated ketones, 1-hydroxyphenyl ketones, ketals, metallocenes, and any combination thereof.

In an embodiment, the liquid radiation curable resin includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl)phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis(diethylamino)benzophenone, and 4,4'-bis(N,N-dimethylamino)benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxy)phenyl]-2-methyl-1-propanone, 4-isopropylphenyl(1-hydroxyisopropyl)ketone, oligo-[2-hydroxy-2-methyl-1-[4-(1-methylvinyl)phenyl]propanone], camphorquinone, 4,4'-bis(diethylamino)benzophenone, benzyl dimethyl ketal, bis(eta 5-2-4-cyclopentadien-1-yl)bis[2,6-difluoro-3-(1H-pyrrol-1-yl)phenyl]titanium, and any combination thereof.

For LED light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl)phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino)benzophenone (Chivacure EMK from Chitec), and 4,4'-bis(N,N'-dimethylamino)benzophenone (Michler's ketone). Also suitable are mixtures thereof.

Additionally, photosensitizers are useful in conjunction with photoinitiators in effecting cure with LED light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthenes and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino)benzophenone (Chivacure EMK from Chitec).

It is possible for LED UV light sources to be designed to emit light at shorter wavelengths. For LED light sources emitting at wavelengths from between about 100 and about 300 nm, it is desirable to employ a photosensitizes with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, and dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hroxyethoxy)phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl]propanone](Esacure KIP 150 from Lamberti).

LED light sources can also be designed to emit visible light. For LED light sources emitting light at wavelengths from about 475 nm to about 900 nm, examples of suitable free radical photoinitiators include: camphorquinone, 4,4'-bis(diethylamino)benzophenone (Chivacure EMK from Chitec), 4,4'-bis(N,N'-dimethylamino)benzophenone (Michler's ketone), bis(2,4,6-trimethylbenzoyl)-phenylphosphineoxide (Irgacure 819 or BAPO from Ciba), metallocenes such as bis(eta 5-2-4-cyclopentadien-1-yl)bis[2,6-difluoro-3-(1H-pyrrol-1-yl)phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

In one embodiment of the instant claimed invention, the light emitted by the LED is UVA radiation, which is radiation with a wavelength between about 320 and about 400 nm. In one embodiment of the instant claimed invention, the light emitted by the LED is UVB radiation, which is radiation with a wavelength between about 280 and about 320 nm. In one embodiment of the instant claimed invention, the light emitted by the LED is UVC radiation, which is radiation with a wavelength between about 100 and about 280 nm.

Embodiments of the invention include up to about 0.5 wt % of a free radical photoinitiator with properties that retard the cationic cure of the resin. The inventors have surprisingly found that incorporating up to about 0.5 wt % of such a component can delay the cationic cure of the liquid radiation curable resin enough to allow for improved peeling from the substrate. Usually, free radical photoinitiators that retard the cationic cure are not used in hybrid liquid radiation curable resins because fast cationic cure is desirable. A particularly preferred example of such a free-radical photoinitiator is bis(2,4,6-trimethylbenzoyl)-phenylphosphineoxide (Irgacure 819 or BAPO from Ciba). In an embodiment the free radical photoinitiator that partially inhibits cationic cure is present in an amount from about 0.05 to about 0.25 w %.

The liquid radiation curable resin can include any suitable amount of the free-radical photoinitiator, for example, in certain embodiments, in an amount up to about 15% by weight of the composition, in certain embodiments, up to about 10% by weight of the composition, and in further embodiments from about 2% to about 8% by weight of the composition.

In accordance with an embodiment, the liquid radiation curable resin composition can further include a chain transfer agent, particularly a chain transfer agent for a cationic monomer. The chain transfer agent has a functional group containing active hydrogen. Examples of the active hydrogen-containing functional group include an amino group, an amide group, a hydroxyl group, a sulfa group, and a thiol group. In an embodiment, the chain transfer agent terminates the propagation of one type of polymerization, i.e., either cationic polymerization or free-radical polymerization and initiates a different type of polymerization, i.e., either free-radical polymerization or cationic polymerization. In accordance with an embodiment, chain transfer to a different monomer is a preferred mechanism. In embodiments, chain transfer tends to produce branched molecules or crosslinked molecules. Thus, chain transfer offers a way of controlling the molecular weight distribution, crosslink density, thermal properties, and/or mechanical properties of the cured resin composition.

Any suitable chain transfer agent can be employed. For example, the chain transfer agent for a cationic polymerizable component is a hydroxyl-containing compound, such as a compound containing 2 or more than 2 hydroxyl-groups. In an embodiment, the chain transfer agent is selected from the group consisting of a polyether polyol, polyester polyol, polycarbonate polyol, ethoxylated or propoxylated aliphatic or aromatic compounds having hydroxyl groups, dendritic polyols, hyperbranched polyols. An example of a polyether polyol is a polyether polyol comprising an alkoxy ether group of the formula $[(CH_2)_nO]_m$, wherein n can be 1 to 6 and m can be 1 to 100.

A particular example of a chain transfer agent is polytetrahydrofuran such as TERATHANE™.

The liquid radiation curable resin composition can include any suitable amount of the chain transfer agent, for example, in certain embodiments, in an amount up to about 50% by weight of the composition, in certain embodiments, up to about 30% by weight of the composition, and in certain other embodiments from about 3% to about 20% by weight of the composition, in other embodiments from about 5 to about 15 wt %.

The liquid radiation curable resin composition of the invention can further include one or more additives selected from the group consisting of bubble breakers, antioxidants, surfactants, acid scavengers, pigments, dyes, thickeners, flame retardants, silane coupling agents, ultraviolet absorbers, resin particles, core-shell particle impact modifiers, soluble polymers and block polymers, organic, inorganic, or organic-inorganic hybrid fillers of sizes ranging from 8 nanometers to about 50 microns.

Stabilizers are often added to the compositions in order to prevent a viscosity build-up, for instance a viscosity build-up during usage in a solid imaging process. In an embodiment, stabilizers include those described in U.S. Pat. No. 5,665,792, the entire disclosure of which is hereby incorporated by reference. Such stabilizers are usually hydrocarbon carboxylic acid salts of group IA and IIA metals. In other embodiments, these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers include polyvinylpyrrolidones and polyacrylonitriles. Other possible additives include dyes, pigments, fillers (e.g. silica particles—preferably cylindrical or spherical silica particles—, talc, glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, titanium oxide, aluminum powder, bronze powder, zinc powder, copper powder, lead powder, gold powder, silver dust, glass fiber, titanic acid potassium whisker, carbon whisker, sapphire whisker, beryllia whisker, boron carbide whisker, silicon carbide whisker, silicon nitride whisker, glass beads, hollow glass beads, metaloxides and potassium titanate whisker), antioxidants, wetting agents, photosensitizers for the free-radical photoinitiator, chain transfer agents, leveling agents, defoamers, surfactants and the like.

In accordance with an embodiment of the invention, the liquid radiation curable resin composition contains the polymerizable components such that the desired photosensitivity is obtained by choosing an appropriate ratio of the initiators and/or polymerizable components. The ratio of the components and of the initiators affect the photosensitivity, speed of curing, degree of curing, crosslink density, thermal properties (e.g., $T_g$), and/or mechanical properties (e.g., tensile strength, storage modulus, loss modulus) of the liquid radiation curable resin composition or of the cured article.

Accordingly, in an embodiment, the ratio by weight of cationic photoinitiator to free-radical photoinitiator (CPI/RPI) is from about 0.1 to about 2.0, preferably from about 0.1 to about 1.0, and more preferably from about 0.2 to about 0.8.

In accordance with an embodiment, the liquid radiation curable resin composition has a ratio by weight of cationic polymerizable component to free-radical polymerizable component (CPC/RPC) from about 0.8 to about 4.5, from about 1.0 to about 4.0, and more preferably from about 1.0 to about 3.5.

The fourth aspect of the instant claimed invention is a three-dimensional object made from the method of the first aspect of the instant claimed invention The third aspect of the instant claimed invention is a method for forming a three-dimensional object comprising:
1) coating a layer of liquid radiation curable resin comprising from 30 to 80 wt %, more preferably from 35 to 80 wt %, more preferably from 35 to 75 wt %, more preferably from 35 to 70 wt % of at least one cationically curable compound on a substrate;
2) contacting the layer of liquid radiation curable resin with a previously cured layer;
3) selectively exposing the layer of liquid radiation curable resin to actinic radiation, provided by a source of actinic radiation, thereby forming a cured layer which adheres to the previously cured layer;
4) separating the cured layer and the substrate; and
5) repeating steps 1-4 a sufficient number of times in order to build up a three-dimensional object;

wherein the storage shear modulus (G') of the liquid radiation curable resin is measured to have achieved a (G') value of greater than about $7.5 \times 10^5$ Pa, preferably greater than $8.5 \times 10^5$ Pa, more preferably greater than $9.5 \times 10^5$ Pa at 2.0 seconds from the beginning of light exposure when the storage shear modulus (G') of the liquid radiation curable resin is measured on a Real Time Dynamic Mechanical Analyzer as the liquid radiation curable resin is cured with a light intensity of 50 mW/cm² for 1.0 second light exposure time.

The fourth aspect of the instant claimed invention is a three-dimensional object made from the method of the third aspect of the instant claimed invention The following examples further illustrate embodiments of the invention but, of course, should not be construed as in any way limiting its scope.

EXAMPLES

Real Time Dynamic Mechanical Analysis
(RT-DMA)

Real Time Dynamic Mechanical Analysis (RT-DMA), including the storage shear modulus (G'), is carried out under ambient lab conditions (20-23° C. and 25-35% RH), on compositions undergoing curing using a StressTech Rheometer (Reologicia Instruments AB, Sweden) with an 8 mm plate, a gap of 0.1 mm, and modified to include a mercury lamp light source (OMNICURE Series 2000 available from EXFO), fitted with a 365 nm interference filter (also available from EXFO) placed in the light path and a liquid-filled light guide for conveying light from the source to the rheometer. The 365 nm interference filter produces the spectral output shown in FIG. 1. The samples are evaluated under the following parameters: 10 s of equilibrium time; frequency of 10 Hz; 50 mW/cm2 light intensity by the IL 1400 radiometer with XRL140B detector (International Light, Newburyport, Mass.); 1.0 s exposure that starts at 2.0 seconds from the beginning of data collection; FFT smoothing of curves; G' taken at 2.5, 2.7, 3, 4, and 6 s from the beginning of data collection by using the accompanying software for data analysis.

Figure 2:
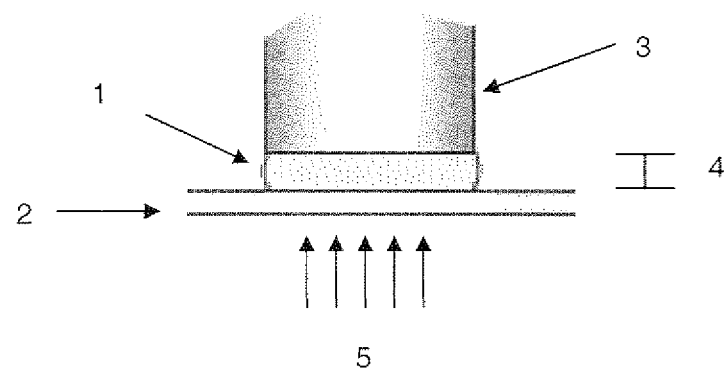

FIG. 2 shows a schematic of the RT-DMA apparatus. The liquid radiation curable resin (1) is placed on a plane (2). The amount of liquid resin used should be approximately the amount indicated in the figure. The plane is a quartz plate that is sold with the StressTech Rheometer. The 8 mm plate (3) is positioned with a 0.1 mm gap (4) between the plate and the plane. The gap is set via the software accompanying the StressTech Rheometer. Light (5) is provided though the plane (2). Please see the publication "Dynamic Mechanical Analysis of UV-Curable Coatings While Curing" by Robert W. Johnson available at http://reologicainstruments.com/PDF%20files/BobJohnsonUVpaper.pdf, and hereby incorporated by reference in its entirety, for more information on RT-DMA.

Separation Time Test Apparatus

Figure 3:
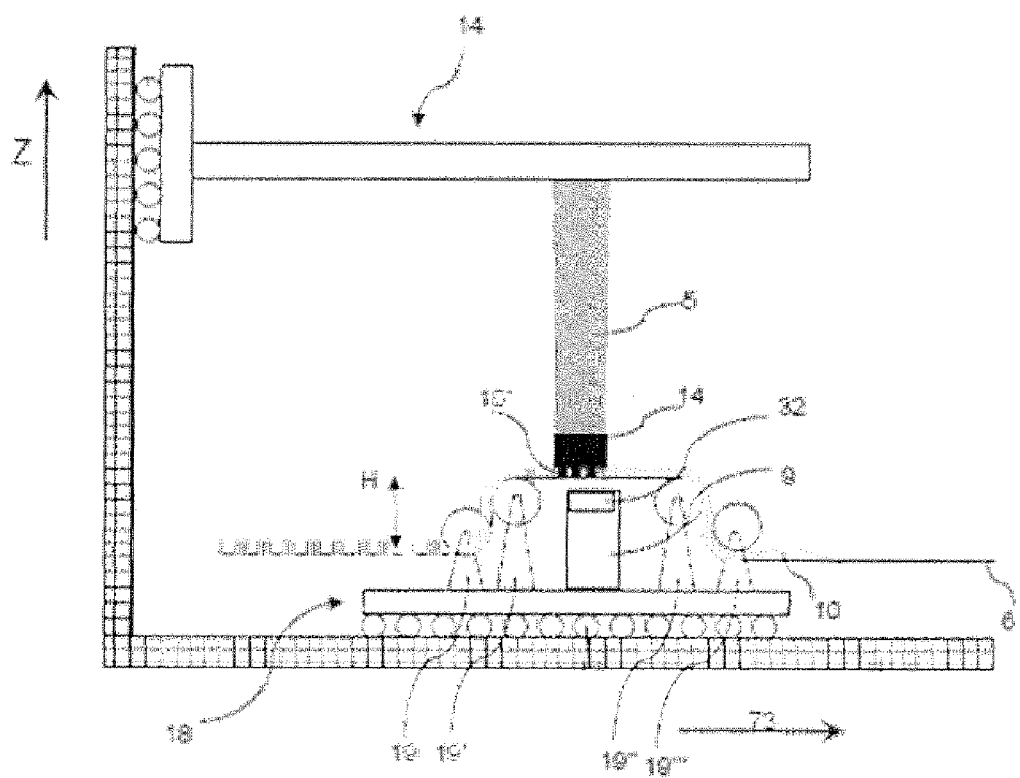

A test apparatus as demonstrated in FIG. 3 is used to measure the separation time. The test apparatus comprises a reciprocable moving carriage (18) of four rollers (19, 19', 19", and 19''') and a 365 nm LED light (32). The LED light is a Model NCSU033A from Nichia Co. with a focused spot size of 1 mm projected onto the resin surface. A flexible radiation-transparent foil substrate (6) made of TPX of 100 micron thickness is positioned on the apparatus and pulled so it is taught. An elevator (14) is stationary in the x and y directions and moveable in the z-direction. The system comprises a leading application roller (19''') and a trailing application roller (19) for applying a layer of liquid radiation curable resin (10). The application rollers are grooved rollers (meyer bars) capable of applying a substantially uniform layer of liquid radiation curable resin (10) on the substrate (6). The system also comprises a leading guiding roller (19") and a trailing guiding roller (19'). The guiding rollers urge the substrate (6) into and out of the appropriate position, thereby separating the freshly cured layer (10') from the substrate.

When the apparatus moves in a first direction (73), the leading application roller (19''') applies a substantially uniform layer of liquid radiation curable resin (10) on the substrate (6). The liquid radiation curable resin on the substrate is then urged into contact with a previously cured layer (14) or the build surface of the elevator. The LED (32) then passes under the part (5), curing the liquid radiation curable resin (10), thereby creating a freshly cured layer (10') of liquid radiation curable resin. The trailing guiding roller (19') then acts to peel the substrate from the freshly cured layer of liquid radiation curable resin by moving the substrate (6) away from the freshly cured layer (10') that has adhered to the previously cured layer (14). The elevator (14) then moves upwards by the amount of one layer thickness, typically 50 microns. The carriage direction is then reversed (to a direction opposite of direction 73) and the process is repeated.

The speed of the reciprocable moving carriage is adjustable. The linear distance from the light source to the center of the trailing peeling roller is 5.5 cm. The guiding rollers (19' and 19") are 1 cm in diameter. Therefore, a 10 mm/sec build time equates to a separation time of 5.5 seconds.

Examples 1-18 and Comparative Examples 1 and 2

Various liquid radiation curable resins were tested in accordance with the invention. Information regarding the components of the liquid radiation curable resins can be found in Table 1. The compositions themselves can be found in Table 2, Table 3, and Table 4. The amount of each component is listed as a wt % of the total composition. Examples are designated by Ex while comparative examples, not to be construed as examples of the invention, are designated by (Comp).

TABLE 1

| Trade Name | Function in Formula | Chemical Descriptor | Supplier |
| --- | --- | --- | --- |
| CD 406 | Free-radical Polymerizable Component | Cyclohexyldiacrylate | Sartomer |
| Celloxide 2021P | Cationic Polymerizable Component | 3,4-Epoxycyclohexylmethyl-3',4'-epoxycyclohexanecarboxylate | Daicel Chemical |
| Chivacure BMS | Photosensitizer | 4-Benzoyl-4'-methyldiphenyl thioether | Chitec |
| DG-0049 | Pigment | Violet pigment in monomer | Desotech |
| DPHA | Free-radical Polymerizable Component | Dipentaerythritol hexaacrylate | Sigma Aldrich |
| Ebecryl 3700 | Cationic Polymerizable Component | Bisphenol A diglycidyl ether diacrylate | Cytec |
| Epolead PB3600 | Cationic Polymerizable Component | 1,3-Butadiene, homopolymer, epoxidized, cyclized | Daicel Chemical |
| Eponox 1510 | Cationic Polymerizable Component | Hydrogenated bisphenol A diglycidyl ether | Hexion |
| Irgacure 184 | Free-radical Photoinitiator | α-Hydroxycyclohexyl phenyl ketone | BASF |
| Irgacure 819 | Free-radical Photoinitiator | Bis(2,4,6-trimethylbenzoyl) phenylphosphine oxide | BASF |

TABLE 1-continued

| Trade Name | Function in Formula | Chemical Descriptor | Supplier |
|---|---|---|---|
| Irgacure PAG 290 | Cationic Photoinitiator | Tris(4-(4-acetylphenyl)thiophenyl)sulfonium tetrakis(pentafluorophenyl)borate | BASF |
| Longnox 10 | Antioxidant | Neopentanetetrayl 3,5-di-tert-butyl-4-hydroxyhydrocinnamate | Longchem C&S Int. |
| NK Ester A-DOG | Free-radical Polymerizable Component | [2-[1,1-dimethyl-2-[(1-oxoallyl)oxy]ethyl]-5-ethyl-1,3-dioxan-5-yl]methyl acrylate | Kowa |
| OXT-101 | Cationic Polymerizable Component | 3-Ethyl-3-(hydroxymethyl)oxetane | Toagosei |
| PVP | Acid scavenger | poly vinyl pyrrolidone | Sigma Aldrich |
| Rhodorsil PI 2074 | Cationic Photoinitiator | 4-Isopropylphenyl)(4-methylphenyl)iodonium tetrakis(pentafluorophenyl)borate | Rhodia |
| Rubidium Carbonate | Acid scavenger | Rubidium Carbonate | Sigma Aldrich |
| SR399J | Free-radical Polymerizable Component | Dipentaerythritol monohydroxypentaacrylate | Sartomer |
| Terathane 1000 | Chain Transfer Agent | polyTHF polyol | Invista |

TABLE 2

|  | Ex 1 | Ex 2 | Ex 3 | Ex 4 | Ex 5 | Ex 6 | Ex 7 |
|---|---|---|---|---|---|---|---|
| Irgacure PAG 290 |  |  |  |  |  |  |  |
| Rhodorsil PI 2074 | 2.00 | 2.00 | 2.00 | 2.00 | 2.00 | 2.00 | 2.00 |
| IR-184 | 3.00 | 3.00 | 4.30 | 3.80 | 3.80 | 3.80 | 3.80 |
| Irgacure 819 |  |  | 0.10 |  |  |  |  |
| Chivacure BMS | 2.00 | 2.00 | 1.50 | 2.00 | 2.00 | 2.00 | 2.00 |
| Rubidium Carbonate | 0.01 |  |  |  |  |  |  |
| CD 406 | 7.00 | 7.00 |  |  |  |  |  |
| SR399J |  |  |  | 10.00 | 8.00 | 9.87 | 9.97 |
| DPHA |  |  |  | 19.28 | 19.94 |  |  |
| NK Ester A-DOG |  |  |  | 8.10 |  |  |  |
| EB3700 | 25.00 | 25.00 | 35.00 |  | 7.58 | 20.63 | 21.98 |
| Celloxide 2021P | 36.00 | 40.07 | 40.37 | 37.27 | 38.54 | 45.46 | 42.06 |
| Terathane1000 | 25.00 | 20.93 | 9.00 | 17.35 | 17.94 | 8.80 | 8.14 |
| OXT-101 |  |  | 7.11 |  |  | 7.24 | 6.70 |
| Longnox 10 |  |  | 0.10 | 0.20 | 0.20 | 0.20 | 0.20 |
| PVP |  | 0.01 | 0.02 |  |  |  |  |
| DG-0049 |  |  | 0.50 |  |  |  |  |
| Epon 1510 |  |  |  |  |  |  |  |
| Epolead PB3600 |  |  |  |  |  |  | 3.16 |
| Total | 100.01 | 100.00 | 100.00 | 100.00 | 100.0 | 100.0 | 100.0 |

TABLE 3

|  | Ex 8 | Ex 9 | Ex 10 | Ex 11 | Ex 12 | Ex 13 | Ex 14 |
|---|---|---|---|---|---|---|---|
| Irgacure PAG 290 |  |  |  | 1.41 | 0.98 | 1.93 | 1.00 |
| Rhodorsil PI 2074 | 2.00 | 2.00 | 2.00 |  |  |  |  |
| IR-184 | 3.80 | 3.80 | 3.80 | 6.00 | 6.00 | 6.00 | 6.00 |
| Irgacure 819 |  |  |  |  |  |  |  |
| Chivacure BMS | 2.00 | 2.00 | 2.00 |  |  |  |  |
| Rubidium Carbonate |  |  |  |  |  |  |  |
| CD 406 |  |  |  |  |  |  |  |
| SR399J |  |  |  |  |  |  |  |
| DPHA | 14.00 | 9.03 | 9.82 | 6.59 | 7.02 | 6.07 | 4.00 |
| NK Ester A-DOG | 20.06 | 20.00 | 20.00 | 20.00 | 20.00 | 20.00 | 20.00 |
| EB3700 |  |  |  |  |  |  |  |

TABLE 3-continued

|  | Ex 8 | Ex 9 | Ex 10 | Ex 11 | Ex 12 | Ex 13 | Ex 14 |
|---|---|---|---|---|---|---|---|
| Celloxide 2021P | 45.00 | 45.00 | 45.00 | 45.84 | 45.84 | 45.84 | 45.84 |
| Terathane1000 | 12.94 | 9.93 | 17.18 | 10.19 | 10.19 | 10.19 | 13.19 |
| OXT-101 | 0.00 | 8.04 |  | 9.17 | 9.17 | 9.17 | 9.17 |
| Longnox 10 | 0.20 | 0.20 | 0.20 | 0.50 | 0.50 | 0.50 | 0.50 |
| PVP |  |  |  | 0.01 | 0.01 | 0.01 | 0.01 |
| DG-0049 |  |  |  | 0.30 | 0.30 | 0.30 | 0.30 |
| Epon 1510 |  |  |  |  |  |  |  |
| Epolead PB3600 | 0.00 | 0.00 |  |  |  |  |  |
| Total | 100.0 | 100.0 | 100.0 | 100.0 | 100.0 | 100.0 | 100.0 |

TABLE 4

|  | Ex 15 | Ex 16 | Ex 17 | Ex 18 | Comp 1 | Comp 2 |
|---|---|---|---|---|---|---|
| Irgacure PAG 290 | 0.75 | 0.55 | 1.00 | 1.50 |  |  |
| Rhodorsil PI 2074 |  |  |  |  | 2.00 | 2.00 |
| IR-184 | 6.00 | 6.00 | 6.00 | 6.00 | 6.00 | 3.80 |
| Irgacure 819 |  |  |  |  |  |  |
| Chivacure BMS |  |  |  |  | 1.00 | 2.00 |
| Rubidium Carbonate |  |  |  |  |  |  |
| CD 406 |  |  |  |  |  |  |
| SR399J |  |  | 6.24 | 5.74 | 4.94 | 10.00 |
| DPHA | 4.00 | 4.00 |  |  |  |  |
| NK Ester A-DOG | 20.00 | 20.00 | 15.57 | 15.57 | 15.57 |  |
| EB3700 |  |  |  |  |  | 24.70 |
| Celloxide 2021P | 45.84 | 45.84 |  |  |  | 38.66 |
| Terathane1000 | 13.44 | 13.64 |  |  |  | 7.49 |
| OXT-101 | 9.17 | 9.17 | 15.70 | 15.70 | 15.70 | 6.16 |
| Longnox 10 | 0.50 | 0.50 | 1.00 | 1.00 | 0.50 | 0.20 |
| PVP | 0.01 | 0.01 |  |  |  |  |
| DG-0049 | 0.30 | 0.30 | 0.20 | 0.20 |  |  |
| Epon 1510 |  |  | 54.30 | 54.30 | 54.30 |  |
| Epolead PB3600 |  |  |  |  |  | 5.00 |
| Total | 100.0 | 100.0 | 100.0 | 100.0 | 100.0 | 100.0 |

The speed of operation of the test apparatus described above was adjusted in 5 minis, starting at a build speed of 10 mm/s, increments until the fastest possible separation delay time for the hybrid cure resins of the invention that allow the successful formation of test parts. The test was performed at an ambient temperature of between 20 and 25° C. and a humidity of between 20 and 40% RH. The LED light (NCSU033A, Nichia) was focused to a spot size of 1 mm projected onto the resin surface. The LED light was powered by a 3.65 V/100 mA DC output from a Programmable Power Supply (Model No. PSS-3203; GW Instek). TPX Opulent foil (X-88BMT4; single-layer film; matt both sides; 100 micron thick; Mitsui Chemicals America, Inc) was used as the substrate. The storage shear modulus (G') was recorded in accordance with the procedure described above. The storage shear modulus values are listed in Pa. The quickest allowable separation delay time was determined by dividing the distance from illumination to peeling (55 mm) by the maximum build speed. Results are presented in Table 5, Table 6, and Table 7.

TABLE 5

|  | Example |||||||
|---|---|---|---|---|---|---|---|
|  | Ex 1 | Ex 2 | Ex 3 | Ex 4 | Ex 5 | Ex 6 | Ex 7 |
| G' 0.5 sec after light on (Pa) | 2923 | 39670 | 2103 | 15580 | 56050 | 1170 | 114 |
| G' 0.7 sec after light on (Pa) | 77770 | 322400 | 112400 | 250200 | 420500 | 19520 | 26230 |
| G' 1.0 sec after light on (Pa) | 440500 | 1057000 | 697900 | 1131000 | 1720000 | 336200 | 278300 |
| G' 2.0 sec after light on (Pa) | 1118000 | 2423000 | 2109000 | 3500000 | 3394000 | 1378000 | 957200 |
| G' 4.0 sec after light on (Pa) | 939500 | 3033000 | 3094000 | 4675000 | 5029000 | 2197000 | 1465000 |
| Max build speed (mm/s) | 15 | 20 | 20 | 20 | 20 | 10 | 10 |
| Quickest Separation Delay Time (sec) | 3.7 | 2.8 | 2.8 | 2.8 | 2.8 | 5.5 | 5.5 |

TABLE 6

| | Ex 8 | Ex 9 | Ex 10 | Ex 11 | Ex 12 | Ex 13 | Ex 14 |
|---|---|---|---|---|---|---|---|
| G' 0.5 sec after light on (Pa) | 11230 | 1616 | 2958 | 7612 | 18810 | 14320 | 9884 |
| G' 0.7 sec after light on (Pa) | 194400 | 140200 | 83283 | 248100 | 195100 | 203300 | 123000 |
| G' 1.0 sec after light on (Pa) | 912800 | 696400 | 501267 | 1068000 | 742500 | 819600 | 555100 |
| G' 2.0 sec after light on (Pa) | 2809000 | 2241000 | 1690333 | 2781000 | 1726000 | 2012000 | 1400000 |
| G' 4.0 sec after light on (Pa) | 3980000 | 3610000 | 2208000 | 3940000 | 2305000 | 2802000 | 1968000 |
| Max build speed (mm/s) | 15 | 15 | 20 | 20 | 25 | 20 | 30 |
| Quickest Separation Delay Time (sec) | 3.7 | 3.7 | 2.8 | 2.8 | 2.2 | 2.8 | 1.8 |

TABLE 7

| | Ex 15 | Ex 16 | Ex 17 | Ex 18 | Comp 1 | Comp 2 |
|---|---|---|---|---|---|---|
| G' 0.5 sec after light on (Pa) | 4732 | 880 | 809 | 2140 | 449 | 709 |
| G' 0.7 sec after light on (Pa) | 124600 | 131200 | 44920 | 33620 | 21440 | 3454 |
| G' 1.0 sec after light on (Pa) | 490700 | 653500 | 360000 | 270900 | 219400 | 117600 |
| G' 2.0 sec after light on (Pa) | 1146000 | 1780000 | 1099000 | 866900 | 697800 | 685700 |
| G' 4.0 sec after light on (Pa) | 1533000 | 2331000 | 1565000 | 1261000 | 1014000 | 1178000 |
| Max build speed (mm/s) | 30 | 20 | 20 | 25 | 20 failed | 10 failed |
| Quickest Separation Delay Time (sec) | 1.8 | 2.8 | 2.8 | 2.2 | N/A | N/A |

Discussion of Results

Each of examples 1-18 is able to achieve a G' value of greater than $9.0 \times 10^5$ Pa by the quickest separation delay time measured. Some interpolation of data is required to determine the G' at the quickest separation delay time since G' values were recorded only at the indicated intervals. Comparative Example 1 is included to demonstrate a resin that is unable to build at a speed of 20 mm/s. A build speed of 20 mm/s equates to a minimum separation delay time of 3 seconds on the Separation Time Test Apparatus. Comparative Example 1 is unable to achieve a G' value of greater than $9.0 \times 10^5$ Pa by 2.75 seconds and fails at the 20 mm/s build speed. Comparative Example 1 was not tested at a build speed of slower than 20 mm/s. Comparative Example 2 failed to achieve a 10 mm/s build speed. The cured layer did not sufficiently separate from the substrate and adhere to the previous layer. The comparative examples are unable to achieve a G' value of $7.5 \times 10^5$ Pa by 2.0 seconds after light on in contrast to the inventive examples which are all able to achieve this value.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value failing within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A method for forming a three-dimensional object comprising:
1) coating a layer of liquid radiation curable resin comprising from 30 to 80 wt % of at least one cationically curable compound on a substrate;
2) contacting the layer of liquid radiation, curable resin with a previously cured layer;
3) selectively exposing the layer of liquid radiation curable resin to actinic radiation, provided by a source of actinic radiation, thereby forming a cured layer which adheres to the previously cured layer;
4) allowing a separation delay time to occur and after the conclusion of the separation delay time separating the cured layer and the substrate; and
5) repeating steps 1-4 a sufficient number of times in order to build up a three-dimensional object;
wherein the separation delay time is the time from first exposure of the layer of liquid radiation curable resin to actinic radiation to the time that the storage shear modulus (G') of the liquid radiation curable resin is measured to have achieved a (G') value of greater than about $9.0 \times 10^5$ Pa, as measured from the beginning of light exposure, when the storage shear modulus (G') of the liquid radiation curable resin is measured on a Real Time Dynamic Mechanical Analyzer as the liquid radiation curable resin is cured with a light intensity of 50 mW/cm² for 1.0 second light exposure time.

2. The method of claim 1 wherein the storage shear modulus of the liquid radiation curable resin is measured at an ambient temperature of from 20° C. to 23° C. and a percent relative humidity of from 25% to 35%.

3. The method of claim 1 wherein the Real Time Dynamic Mechanical Analyzer is set up with an 8 mm plate and a sample gap of 0.10 mm.

4. The method of claim 1 wherein the storage shear modulus of the liquid radiation curable resin is measured at a frequency of 10 Hz and a 10 second equilibrium time.

5. The method of claim 1 wherein the cured layer does not adhere to the substrate and adheres to the previously cured layer.

6. The method of claim 1 wherein the liquid radiation curable resin is able to achieve a storage shear modulus of greater than about $7.5 \times 10^5$ 2.0 seconds after light exposure begins when measured on a Real Time Dynamic Mechanical Analyzer.

7. The method of claim 1 wherein the light intensity of 50 mW/cm² has a spectral output with a peak at about 365 nm.

8. The method of claim 1 wherein the light intensity of 50 mW/cm² and the source of actinic radiation have the same spectral output.

9. The method of claim 1 wherein the source of actinic radiation is one or more LEDs.

10. The method of claim 1 wherein the one or more LEDs emit light at a wavelength of from 340-400 nm.

11. The method of claim 1 wherein the separation delay time does not exceed 15.0 seconds.

12. The method of claim 1 wherein the liquid radiation curable resin further comprises: from about 0.5 to about 10 wt % of at least one cationic photoinitiator; from 15 to 40 wt % of at least one free radical polymerizable component; and from about 1 to about 10 wt % of at least one free radical photoinitiator.

13. The method of claim 12 wherein the at least one cationic photoinitiator comprises a triaryl sulfonium salt.

14. The method of claim 13 wherein the triarly sulfonium salt is a triaryl sulfonium tetrakis(pentafluorophenyl)borate.

15. The method of claim 14 wherein the triaryl sulfonium tetrakis(pentafluorophenyl)borate is tris(4-(4-acetylpheny]) thiophenyl)sulfonium tetrakis(pentafluorophenyl)borate.

16. The method of claim 1 wherein the liquid radiation curable resin comprises more than one free radical photoinitiator.

17. The method of claim 16 wherein a free radical photoinitiator is bis(2,4,6-trimethylbenzoyl)-phenylphosphine oxide and is present in an amount less than 0.5 wt % of the liquid radiation curable resin.

18. The method of claim 1 wherein the substrate is substantially inelastic.

19. The method of claim 1 wherein the substrate is less than 250 microns thick.

20. The method of claim 1 wherein the amount of cationically polymerizable compounds is from about 40 wt % to about 60 wt %.

21. The method of claim 1 wherein a cationically polymerizable component is an epoxidized polybutadiene present in an amount from about 5 wt % to about 20 wt %.

22. The method of claim 1 wherein the layer of liquid radiation curable resin is from about 25 microns to about 250 microns in thickness.

23. The method of claim 1 wherein the actinic radiation must travel through the substrate to reach the liquid radiation curable resin.

24. A method for forming a three-dimensional object comprising:
1) coating a layer of liquid radiation curable resin comprising from 35 to 70 wt % of at least one cationically curable compound on a substrate;
2) contacting the layer of liquid radiation curable resin with a previously cured layer;
3) selectively exposing the layer of liquid radiation curable resin to actinic radiation, provided by a source of actinic radiation, thereby forming a cured layer which adheres to the previously cured layer;
4) separating the cured layer and the substrate; and
5) repeating steps 1-4 a sufficient number of times in order to build up a three dimensional object; wherein the storage shear modulus (G') of the liquid radiation curable resin is measured to have achieved a (G') value of greater than $9.5 \times 10^5$ Pa at 2.0 seconds from the beginning of light exposure when the storage shear modulus (G') of the liquid radiation curable resin is measured on a Real Time Dynamic Mechanical Analyzer as the liquid radiation curable resin is cured with a light intensity of 50 mW/cm² for 1.0 second light exposure time.

* * * * *